(12) United States Patent
Sakakura

(10) Patent No.: US 7,608,892 B2
(45) Date of Patent: Oct. 27, 2009

(54) SEMICONDUCTOR DEVICE AND MANUFACTURING METHOD OF THE SAME

(75) Inventor: Masayuki Sakakura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 68 days.

(21) Appl. No.: 11/783,777

(22) Filed: Apr. 12, 2007

(65) Prior Publication Data
US 2007/0278577 A1    Dec. 6, 2007

(30) Foreign Application Priority Data
Apr. 28, 2006    (JP)    ............................ 2006-126220

(51) Int. Cl.
*H01L 29/94*    (2006.01)
(52) U.S. Cl. ................ 257/347; 257/352; 257/E29.151
(58) Field of Classification Search ................. 257/347, 257/352–354, E29.151; 438/151, FOR. 184, 438/FOR. 201
See application file for complete search history.

(56) References Cited

U.S. PATENT DOCUMENTS 5,309,010 A * 5/1994 Kitajima ..................... 257/347

6,388,291 B1 5/2002 Zhang et al.
6,433,361 B1 8/2002 Zhang et al.

FOREIGN PATENT DOCUMENTS

JP    08-018055    1/1996

* cited by examiner

*Primary Examiner*—Zandra Smith
*Assistant Examiner*—Paul E Patton
(74) *Attorney, Agent, or Firm*—Nixon Peabody LLP; Jeffrey L. Costellia

(57) ABSTRACT

To reduce the adverse affect that characteristics of end portions of a channel forming region of a semiconductor film have on characteristics of a transistor. A gate electrode is formed over a channel forming region of a semiconductor film over a substrate, with a gate insulating film interposed therebetween. The semiconductor film is disposed in a region inside end portions of the gate insulating film. A side surface of the channel forming region is not in contact with at least the gate insulating film, so there is a space enclosed by the substrate, the side surface of the channel forming region, and the gate insulating film. Further, the side surface of the channel forming region is not necessarily in contact with the gate electrode. There may be a space enclosed by the substrate, the side surface of the channel forming region, the gate insulating film, and the gate electrode.

15 Claims, 20 Drawing Sheets

SEMICONDUCTOR DEVICE AND MANUFACTURING METHOD OF THE SAME

BACKGROUND OF THE INVENTION

1. Field of the Invention

The present invention relates to semiconductor devices and to methods of manufacturing the same.

2. Description of the Related Art

In recent years, there has been extensive production of semiconductor devices in which a thin film transistor (a TFT) is formed over a substrate having an insulating surface such as glass and used as a switching element or the like. Over a substrate having an insulating surface, an island-shaped semiconductor film is formed using a CVD method, a photolithography process, or the like, and the thin film transistor is provided such that part of the island-shaped semiconductor film is used as a channel forming region of the transistor (for example, see Reference 1: Japanese Published Patent Application No. H08-018055).

Schematic diagrams of a common thin film transistor are shown in FIGS. 16A to 16C. The thin film transistor has an island-shaped semiconductor film 903 over a substrate 901, with an insulating film 902 that serves as a base film interposed therebetween. A conductive film 905 that serves as a gate electrode is provided so as to intersect the island-shaped semiconductor film 903 with a gate insulating film 904 interposed therebetween. Further, the semiconductor film 903 includes a channel forming region 903a formed in a region which overlaps with the conductive film 905, and impurity regions 903b which form source or drain regions. Further, conductive films 907 which form source or drain electrodes are provided so as to be electrically connected to the impurity regions 903b. Note that FIGS. 16B and 16C show cross-sectional structures taken along the broken line joining $C_1$ and $D_1$ in FIG. 16A and the broken line joining $C_2$ and $D_2$ in FIG. 16A, respectively.

SUMMARY OF THE INVENTION

However, when a semiconductor film is provided so as to have an island shape, since a step results at an edge of the semiconductor film and the base insulating film, a problem that is caused by insufficient coverage by the gate insulating film of a surface of a channel forming region of the semiconductor film in a step section such as a region 908 shown in FIG. 16C may occur. For example, when coverage by the gate insulating film is not sufficient at the end portion, at an end portion of the semiconductor film, the conductive film that forms a gate electrode may be in contact with the semiconductor film, and a short circuit may occur. Further, due to film thinning of the gate insulating film at the end portion, problems may occur such as deterioration of transistor characteristics caused by current leaking in an end portion of the channel forming region of the semiconductor film and the gate electrode. Problems caused by insufficient coverage of an end portion of the semiconductor film occur more readily when the gate insulating film is made thinner. In recent years, as increased thinning of the gate insulating film has been desired in order to decrease power consumption and improve operating speed of the thin film transistor, the problems have become particularly marked.

Further, when fixed charge is trapped at an end portion of the semiconductor film due to breakdown of the gate insulating film or treatment during the manufacturing process, a problem may occur in that characteristics of the channel forming region at the end portion may change compared with the center portion of the semiconductor film, and the characteristics of the thin film transistor may be adversely affected.

In view of the foregoing, an object of the present invention is to provide a semiconductor device in which the extent to which the characteristics of an end portion of a channel forming region of a semiconductor film adversely affect the characteristics of a transistor is reduced, and to provide a method of manufacturing such a semiconductor device.

A semiconductor device of the invention includes at least a substrate, a semiconductor film having a channel forming region, that is formed over the substrate, a gate insulating film that covers the semiconductor film and has side surfaces in a region outside side surfaces of the semiconductor film, and a gate electrode that covers the channel forming region with the gate insulating film interposed therebetween. In addition, the semiconductor device may include an insulating film that covers the gate electrode, the gate insulating film, and the substrate.

A semiconductor device of the invention includes at least a substrate, a semiconductor film having a channel forming region, that is formed over the substrate, a gate insulating film that covers the semiconductor film and has side surfaces in a region outside side surfaces of the semiconductor film, a gate electrode that covers the channel forming region with the gate insulating film interposed therebetween, a space formed by side end portions of the channel forming region, the gate insulating film, and the substrate, and an insulating film that covers the gate electrode, the gate insulating film, and the substrate.

A semiconductor device of the invention includes at least a substrate, a semiconductor film having a channel forming region, that is formed over the substrate, a gate insulating film that covers the semiconductor film and has side surfaces in a region outside side surfaces of the semiconductor film, a gate electrode that covers the channel forming region with the gate insulating film interposed therebetween, a space formed by side end portions of the channel forming region, the gate insulating film, the gate electrode, and the substrate, and an insulating film that covers the gate electrode, the gate insulating film, and the substrate.

In a semiconductor device of the invention, the semiconductor film includes a source region and a drain region, and side surfaces of the source region and the drain region are not in contact with the insulating film formed over the source region and the drain region.

In a semiconductor device of the invention, the semiconductor film includes a source region and a drain region. The semiconductor device includes an insulating film formed over the source region and the drain region, and a space that is enclosed by the substrate, side surfaces of the source region or the drain region, the gate insulating film, and the insulating film.

A semiconductor device of the invention includes a first semiconductor film having a first channel forming region, that is formed over a substrate, a first gate electrode that is formed over the first semiconductor film and covers the first channel forming region with a first gate insulating film interposed therebetween, a second semiconductor film having a second channel forming region, that is formed over the substrate, and a second gate electrode that is formed over the second semiconductor film and covers the second channel forming region with a second gate insulating film interposed therebetween. The first semiconductor film is disposed in a region inside end portions of the first gate insulating film. Side surfaces of the first channel forming region are not in contact with the first gate electrode or the first gate insulating film. The second semiconductor film is disposed in a region inside end portions of the second gate insulating film. Side surfaces of the second channel forming region are not in contact with the second gate electrode or the second gate insulating film.

A semiconductor device of the invention includes a first semiconductor film having a first channel forming region, that is formed over a substrate, a first gate electrode that is formed over the first semiconductor film and covers the first channel forming region with a first gate insulating film interposed therebetween, a space that is enclosed by the substrate, side surfaces of the first channel forming region, the first gate insulating film, and the first gate electrode, a second semiconductor film having a second channel forming region, that is formed over the substrate, a second gate electrode that is formed over the second semiconductor film and covers the second channel forming region with a second gate insulating film interposed therebetween, and a space enclosed by the substrate, side surfaces of the second channel forming region, the second gate insulating film, and the second gate electrode.

In a method of manufacturing a semiconductor device of the invention, a semiconductor film is formed over a substrate, an insulating film is formed over the semiconductor film, a resist is selectively formed over the insulating film, the semiconductor film and the insulating film are etched using the resist as a mask to form a first semiconductor film and a gate insulating film, the first semiconductor film is etched using the resist and the gate insulating film as a mask to form a second semiconductor film which is disposed in a region inside the gate insulating film, and a gate electrode is formed so as to cover a channel forming region of the second semiconductor film with the gate insulating film interposed therebetween. The gate insulating film and the gate electrode are formed such that they are not in contact with side surfaces of the channel forming region.

In a method of manufacturing a semiconductor device of the invention, a semiconductor film is formed over a substrate, an insulating film is formed over the semiconductor film, a resist is selectively formed over the insulating film, the semiconductor film and the insulating film are etched using the resist as a mask to form a first semiconductor film and a gate insulating film, the first semiconductor film is etched using the resist and the gate insulating film as a mask to form a second semiconductor film which is disposed in a region inside the gate insulating film, and a gate electrode is formed so as to cover a channel forming region of the second semiconductor film with the gate insulating film interposed therebetween, thereby forming a space enclosed by the substrate, side surfaces of the channel forming region, the gate insulating film, and the gate electrode.

In a method of manufacturing a semiconductor device of the invention, a semiconductor film is formed over a substrate, an insulating film is formed over the semiconductor film, a resist is selectively formed over the insulating film, the insulating film is etched using the resist as a mask to form a gate insulating film, the semiconductor film is etched using the resist as a mask to form a semiconductor film which is disposed in a region inside the gate insulating film, and a gate electrode is formed so as to cover a channel forming region of the semiconductor film with the gate insulating film interposed therebetween. The gate insulating film and the gate electrode are formed such that they are not in contact with side surfaces of the channel forming region.

In a method of manufacturing a semiconductor device of the invention, a semiconductor film is formed over a substrate, an insulating film is formed over the semiconductor film, a resist is selectively formed over the insulating film, the insulating film is etched using the resist as a mask to form a gate insulating film, the semiconductor film is etched using the resist as a mask to form a semiconductor film which is disposed in a region inside the gate insulating film, and a gate electrode is formed so as to cover a channel forming region of the semiconductor film with the gate insulating film interposed therebetween, thereby forming a space enclosed by the substrate, side surfaces of the channel forming region, the gate insulating film, and the gate electrode.

Since a semiconductor device of the invention includes regions in which side surfaces of a channel forming region of a semiconductor film are not in contact with a gate insulating film or a gate electrode, short circuits and leakage current caused by insufficiency of coverage by the gate insulating film at the side surfaces of the channel forming region do not occur, so characteristics of the semiconductor device can be improved. Further, since side surfaces of the channel forming region of the semiconductor film are not in contact with the gate insulating film or the gate electrode, electric field concentration does not occur at end portions of the channel forming region, the occurrence of gate leakage faults is reduced, and the withstand voltage of the gate electrode can be improved.

DETAILED DESCRIPTION OF THE INVENTION

Figure 1A:
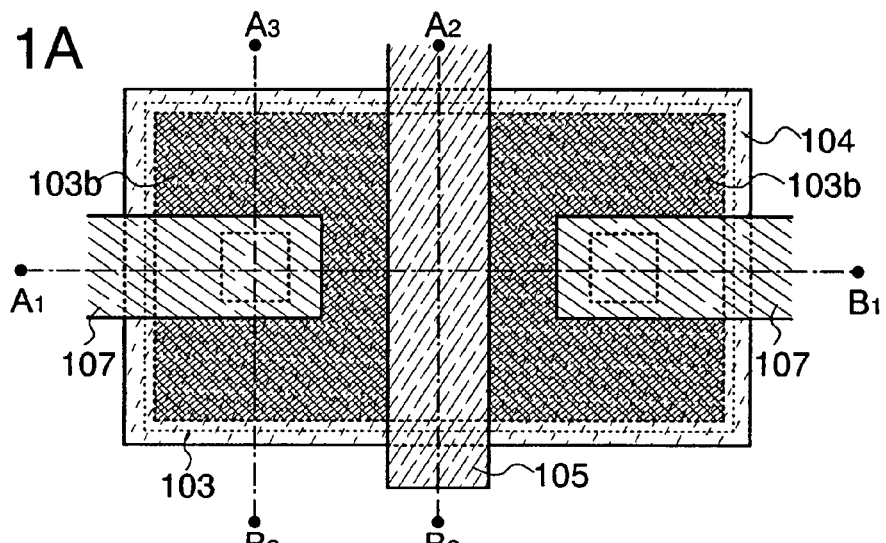
FIGS. 1A to 1D show an example of a semiconductor device of the invention.

Hereinafter, embodiment modes of the invention will be described, with reference to the accompanying drawings. However, the invention is not limited to the description below, and those skilled in the art will appreciate that a variety of modifications can be made to the modes and their details without departing from the spirit and scope of the invention. Accordingly, the invention should not be construed as being limited to the description of the embodiment modes below. Note that in the following description of structures of the invention, like reference numerals may be used to indicate like parts throughout the drawings. Further, Embodiment Modes 1 to 3 below can be implemented by being freely combined.

Embodiment Mode 1

In this embodiment mode, an example of a semiconductor device of the invention will be described with reference to the drawings.

Figure 1B:
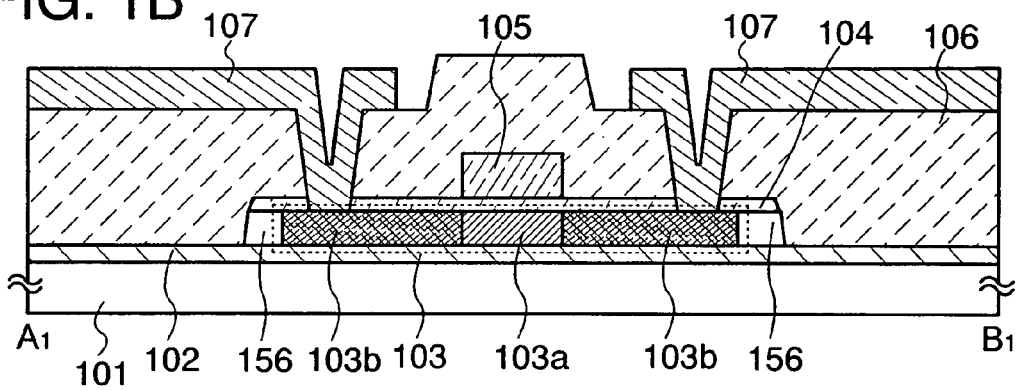
Figure 1C:
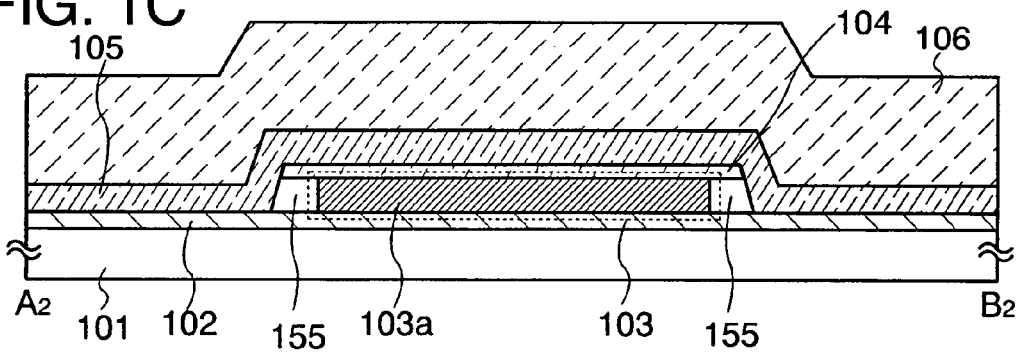
Figure 1D:
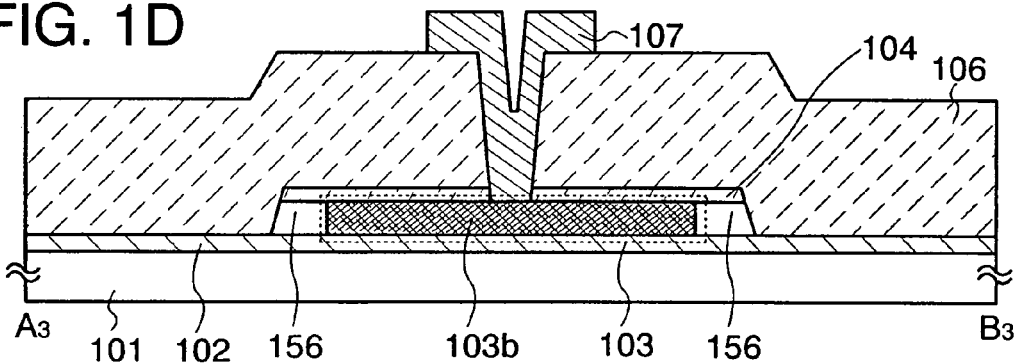
Figure 8A:
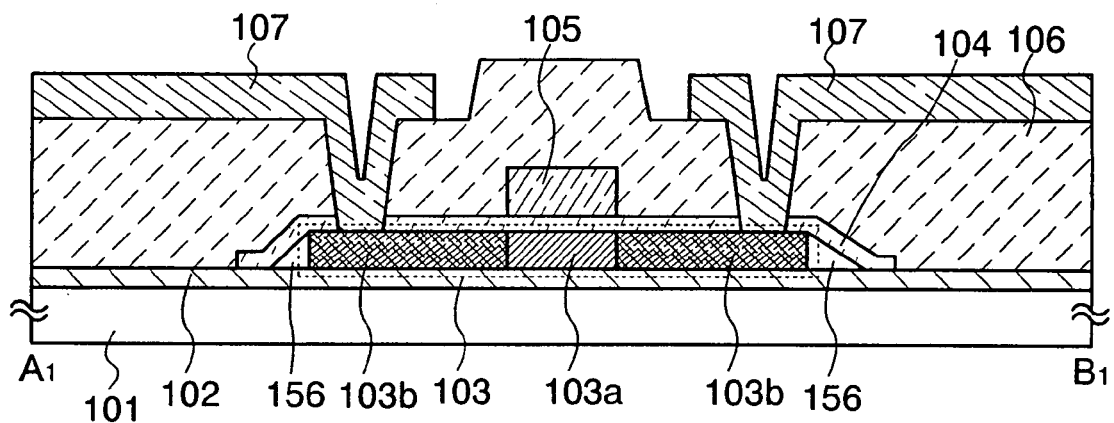
FIGS. 8A to 8C show an example of a semiconductor device of the invention.
Figure 8B:
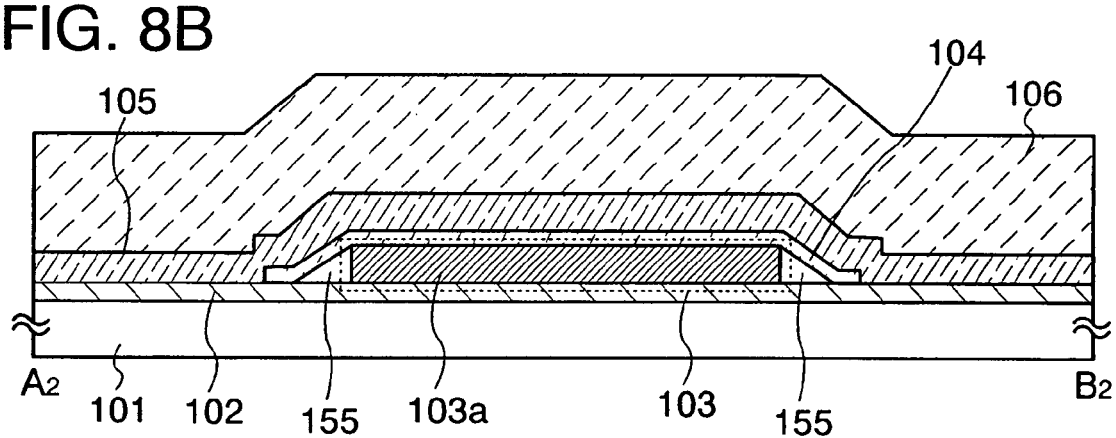
Figure 8C:
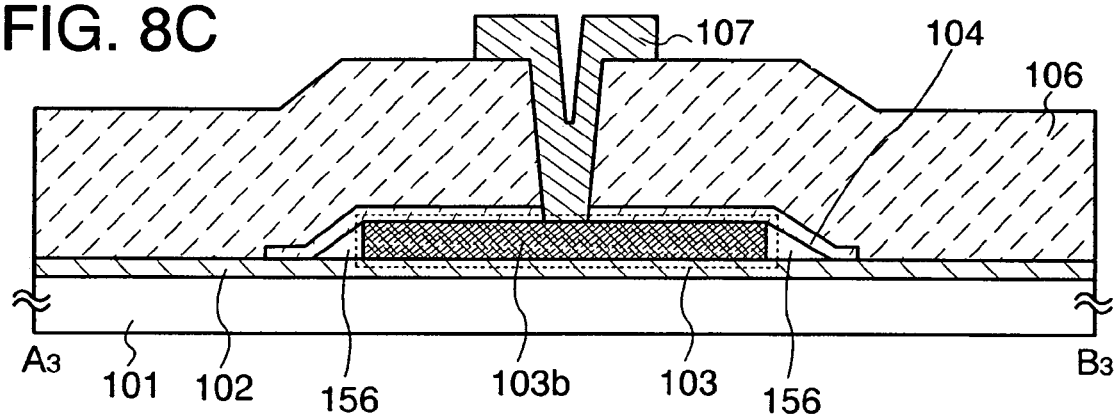

A semiconductor device described in this embodiment mode is shown in FIGS. 1A to 1D. Note that FIG. 1A shows part of an upper surface of a semiconductor device described in this embodiment mode, and FIGS. 1B, 1C, and 1D show cross sections taken along the broken line joining $A_1$ and $B_1$, the broken line joining $A_2$ and $B_2$, and the broken line joining $A_3$ and $B_3$, respectively, of FIG. 1A. Further, FIGS. 8A to 8C are schematic diagrams of a semiconductor device with a different structure to that of the semiconductor device shown in FIGS. 1A to 1D. FIGS. 8A, 8B and 8C show cross sections taken along the broken line joining $A_1$ and $B_1$, the broken line joining $A_2$ and $B_2$, and the broken line joining $A_3$ and $B_3$, respectively, of FIG. 1A.

The semiconductor devices described in this embodiment mode each include a semiconductor film 103 having an island shape, that is provided over a substrate 101 with an insulating film 102 interposed therebetween, a thin film transistor including a conductive film 105 that forms a gate electrode that is provided over the semiconductor film 103 with a gate insulating film 104 interposed therebetween, an insulating film 106 that covers the gate insulating film 104 and the conductive film 105, and conductive films 107 that serve as source electrodes and drain electrodes, that are provided over the insulating film 106 (FIGS. 1A to 1D and 8A to 8C). Note that the semiconductor film 103 includes a channel forming region 103a and source and drain regions (hereinafter also referred to as impurity regions) 103b.

In this embodiment mode, the semiconductor film 103 having an island shape is disposed in a region inside end portions of the gate insulating film 104, and is provided such that the conductive film 105 that forms a gate electrode is not in contact with side surfaces of the channel forming region 103a of the semiconductor film 103. That is, a semiconductor device of this embodiment mode includes a space 155 that is enclosed by the insulating film 102 which is a base, side surfaces of the channel forming region 103a of the semiconductor film 103, the gate insulating film 104, and the conductive film 105 that forms a gate electrode (FIG. 1C). Note that a structure in which end portions of the gate insulating film 104 are in contact with the base insulating film 102 and the gate insulating film 104 is not in contact with the side surfaces of the channel forming region 103a may be employed. In such a case, the space 155 is a region enclosed by the base insulating film 102, side surfaces of the channel forming region 103a of the semiconductor film 103, and the gate insulating film 104 (FIG. 8B).

Note that here, the gate insulating film 104 not being in contact with a side surface of the channel forming region 103a means that in the vicinity of a step section formed by the channel forming region 103a and the insulating film 102, the gate insulating film 104 is not in contact with a side surface of the channel forming region 103a. Accordingly, part of the side surface may be in contact with the gate insulating film 104. In the step section formed by the channel forming region 103a and the insulating film 102, since the channel forming region 103a is not in contact with the gate insulating film 104 or the conductive film 105, the extent to which insufficient coverage by the gate insulating film 104 adversely affects the semiconductor device can be reduced. That is, at the side surface of the channel forming region 103a, electric field concentration does not occur, gate leakage faults are reduced, and the withstand voltage of the gate electrode can be improved.

Further, the insulating film 106 is formed so as not to be in contact with side surfaces of the source region or the drain region 103b, so a space 156 enclosed by the base insulating film 102, the side surfaces of the source region or the drain region 103b, the gate insulating film 104, and the insulating film 106 is formed (FIGS. 1B and 1D). Note that end portions of the gate insulating film 104 may be formed so as to be in contact with the base insulating film 102. In such a case, the space 156 is a region enclosed by the base insulating film 102, side surfaces of the source or drain region 103b of the semiconductor film 103, and the gate insulating film 104 (FIGS. 8A and 8C). Note that here, the space 156 is not necessarily provided, and the source and drain regions 103b may be formed so as to be in contact with the insulating film 106.

The conductive film 105 that forms a gate electrode is formed so as to cover the island-shaped semiconductor film 103. That is, the conductive film 105 is provided so as to cover the channel forming region 103a of the island-shaped semiconductor film 103. Note that here, a case where the conductive film 105 has a single-layer structure is described; however, the invention is not limited to this, and a structure in which two, three or more layers of conductive material are stacked may also be employed.

The semiconductor film 103 having an island shape includes the channel forming region 103a, which is provided in a region that overlaps with the conductive film 105 with the gate insulating film 104 interposed therebetween. Also included are the impurity regions 103b that serve as source or drain regions, which do not overlap with the conductive film 105 and are provided adjacent to the channel forming region 103a.

Further, the conductive films 107 that serve as source and drain electrodes are provided so as to be electrically connected with the impurity regions 103b through openings formed in the insulating film 106.

Next, an example of a method of manufacturing the semiconductor device shown in FIGS. 1A to 1D will be described, with reference to the drawings. Note that FIGS. 2A to 2C and 3A to 3C show cross sections taken along the broken line joining $A_1$ and $B_1$ in FIG. 1A, FIGS. 4A to 4C and 5A to 5C show cross sections taken along the broken line joining $A_2$ and $B_2$ in FIG. 1A, and FIGS. 6A to 6C and 7A to 7C show cross sections taken along the broken line joining $A_3$ and $B_3$ in FIG. 1A.

Figure 2A:
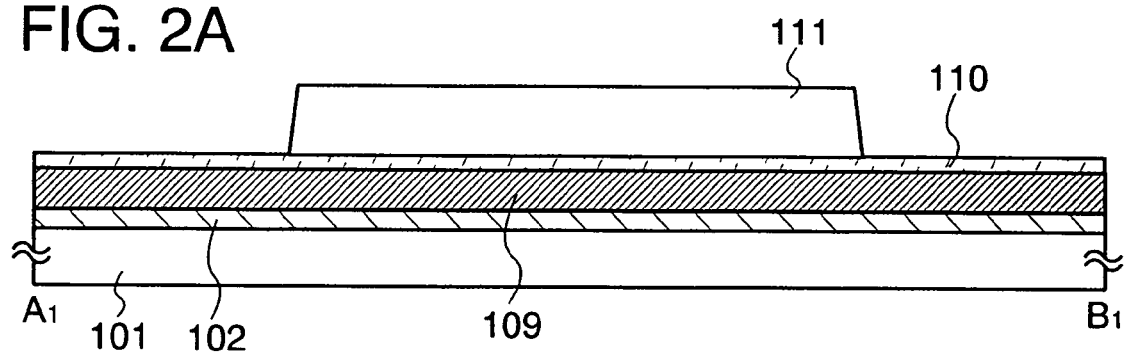
FIGS. 2A to 2C show an example of a manufacturing method of a semiconductor device of the invention.
Figure 4A:
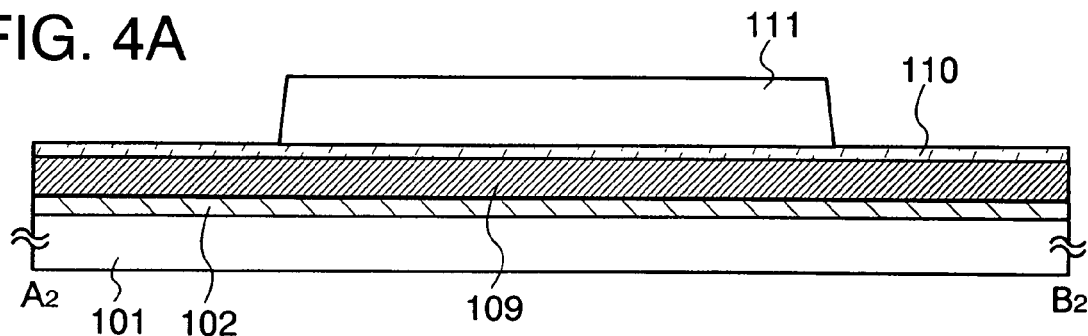
FIGS. 4A to 4C show an example of a manufacturing method of a semiconductor device of the invention.
Figure 6A:
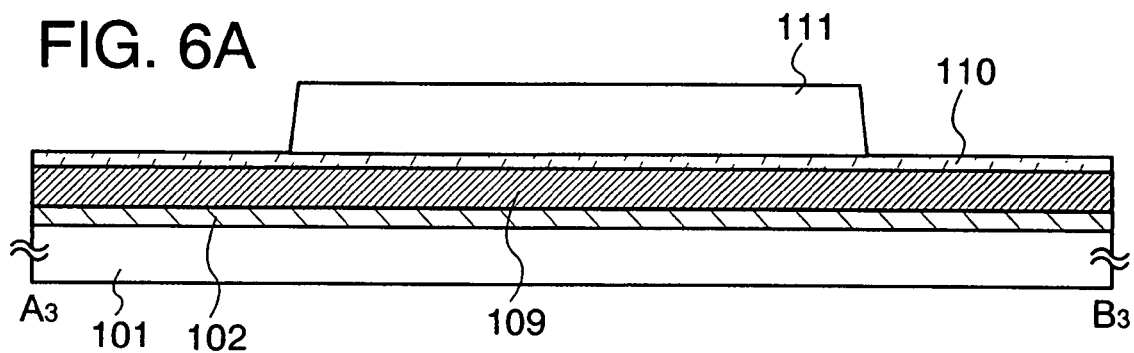
FIGS. 6A to 6C show an example of a manufacturing method of a semiconductor device of the invention.

First, the insulating film 102 is formed over the substrate 101, a semiconductor film 109 is formed over the insulating film 102, and an insulating film 110 is formed over the semiconductor film 109 (FIGS. 2A, 4A, and 6A).

The substrate 101 is a glass substrate, a quartz substrate, a metal substrate (for example, a stainless steel substrate or the like), a ceramic substrate, or a semiconductor substrate such as a Si substrate. Alternatively, a plastic substrate formed of polyethylene terephthalate (PET), polyethylene naphthalate (PEN), polyether sulfone (PES), acrylic, or the like can be used.

The insulating film 102 is formed by a CVD method, a sputtering method, or the like, using an insulating material such as silicon oxide, silicon nitride, silicon oxynitride ($SiO_xN_y$, where x>y>0), or silicon nitride oxide ($SiN_xO_y$, where x>y>0). For example, when the insulating film 102 has a two-layer structure, a silicon nitride oxide film may be formed as a first insulating film layer and a silicon oxynitride film may be formed as a second insulating film layer. Alternatively, a silicon nitride film may be formed as a first insulating film layer and a silicon oxide film may be formed as a second insulating film layer. By forming the insulating film 102 serving as a blocking layer in this manner, an alkali metal such as Na or an alkaline earth metal from the substrate 101 can be prevented from adversely affecting an element formed over the insulating film. Note that the insulating film 102 may be omitted from the structure in some cases, such as when quartz is used as the substrate 101.

The semiconductor film 109 is formed of an amorphous semiconductor film or a crystalline semiconductor film. A crystalline semiconductor film may be a film obtained by using thermal treatment or laser light irradiation to crystallize an amorphous semiconductor film formed over the insulating film 102; a film obtained by making a crystalline semiconductor film formed over the insulating film 102 amorphous, then recrystallizing it; or the like.

In the case of conducting crystallization or recrystallization by laser light irradiation, an LD-pumped continuous wave (CW) laser (e.g., $YVO_4$, second harmonic (wavelength 532 nm)) can be used as a laser light source. Although the wavelength is not specifically limited to the second harmonic, the second harmonic is superior to harmonics higher than that in terms of energy efficiency. When a semiconductor film is irradiated with CW laser, continuous energy is applied to the semiconductor film. Therefore, once the semiconductor film is converted to a molten state, the molten state can be maintained. Further, by scanning the semiconductor film with CW laser, a solid-liquid interface of the semiconductor film can be moved, and crystal grains which are long in one direction, which matches the direction of the movement, can be formed. A reason for using a solid-state laser is that compared to a gas laser or the like, a solid-state laser has a more stable power output, so more stable treatment can be expected. Note that the laser light source is not limited to a CW laser, and a pulsed laser with a repetition rate of 10 MHz or higher can also be used. When a pulsed laser with a high repetition rate is used, if a pulse interval of the laser is shorter than the time it takes for a semiconductor film to solidify after being melted, the semiconductor film can be maintained in a molten state, and by moving the solid-liquid interface, a semiconductor film with crystal grains which are long in one direction can be formed. It is also possible to employ another type of CW laser or pulsed laser with a repetition rate of 10 MHz or higher. For example, a gas laser such as an Ar laser, a Kr laser, or a $CO_2$ laser can be used. A solid-state laser such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, or a $YVO_4$ laser can be used. Further, a ceramic laser such as a YAG laser, a $Y_2O_3$ laser, a $GdVO_4$ laser, or a $YVO_4$ laser can also be used. A metal vapor laser such as a helium-cadmium laser or the like can be used. It is preferable to emit laser lights from a laser oscillator with $TEM_{00}$ (single transverse mode), since by doing so, the energy uniformity of a linear beam spot obtained on a surface that is irradiated can be increased. Further, a pulsed excimer laser can also be used.

As the insulating film 110, silicon oxide, silicon nitride, silicon oxynitride ($SiO_xN_y$, where x>y>0), silicon nitride oxide ($SiN_xO_y$, where x>y>0), or the like is used. Such an insulating layer is formed by a vapor growth method or a sputtering method. Alternatively, the insulating film 110 can be formed by conducting high density plasma treatment to oxidize or nitride the surface of the semiconductor film 109 under an atmosphere containing oxygen (e.g., under an atmosphere containing oxygen ($O_2$) and a rare gas (at least one of He, Ne, Ar, Kr, and Xe) or an atmosphere containing oxygen, hydrogen ($H_2$), and a rare gas) or an atmosphere containing nitrogen (e.g., under an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas).

The high-density plasma treatment is conducted with an electron density of greater than or equal to $1 \times 10^{11}/cm^3$ with the plasma having an electron temperature of less than or equal to 1.5 eV, in an above-described gas atmosphere. More specifically, the electron density is greater than or equal to $1 \times 10^{11}/cm^3$ and less than or equal to $1 \times 10^{13}/cm^3$, and the electron temperature of the plasma is greater than or equal to 0.5 eV and less than or equal to 1.5 eV. The electron density of the plasma is high and the electron temperature in the vicinity of an object to be treated (here, the semiconductor film 109) formed over the substrate 101 is low; therefore, the object to be treated can be prevented from being damaged by the plasma. In addition, because the plasma has a high electron density of $1 \times 10^{11}/cm^3$ or more, an oxide or nitride film formed by using plasma treatment to oxidize or nitride an object to be treated has superior uniformity of film thickness and the like and can be denser, compared with a film formed by a CVD method, a sputtering method, or the like. In addition, since the plasma has a low electron temperature of 1.5 eV or less, oxidation or nitridation treatment can be conducted at a lower temperature than conventional plasma treatment or thermal oxidation methods. For example, oxidation or nitridation treatment can be conducted sufficiently even when the plasma treatment is conducted at a temperature which is 100° C. or more lower than the strain point of a glass substrate. As a frequency for producing plasma, high frequency waves such as microwaves (e.g., microwaves with a frequency of 2.45 GHz) can be used. By oxidizing or nitriding the surface of the semiconductor film 109 by high-density plasma treatment to form the insulating film 110, the level of density of defects, which trap electrons and holes, can be reduced.

Further, in order to control a threshold value or the like, an impurity element may be introduced into the semiconductor film 109 in advance at a low concentration. In that case, the impurity element is also introduced into a region which is to later be a channel forming region in the semiconductor film 109. As an impurity element, an impurity element which imparts n-type conductivity or an impurity element which imparts p-type conductivity can be used. As an impurity element exhibiting n-type conductivity, phosphorus (P), arsenic (As), or the like can be used. As an impurity element exhibiting p-type conductivity, boron (B), aluminum (Al), gallium (Ga), or the like can be used. For example, as the impurity element, boron (B) may be introduced in advance into an entire surface of the semiconductor film 109 such that it is included at a concentration of $5\times10^{15}$ to $5\times10^{17}/cm^3$.

Figure 2B:
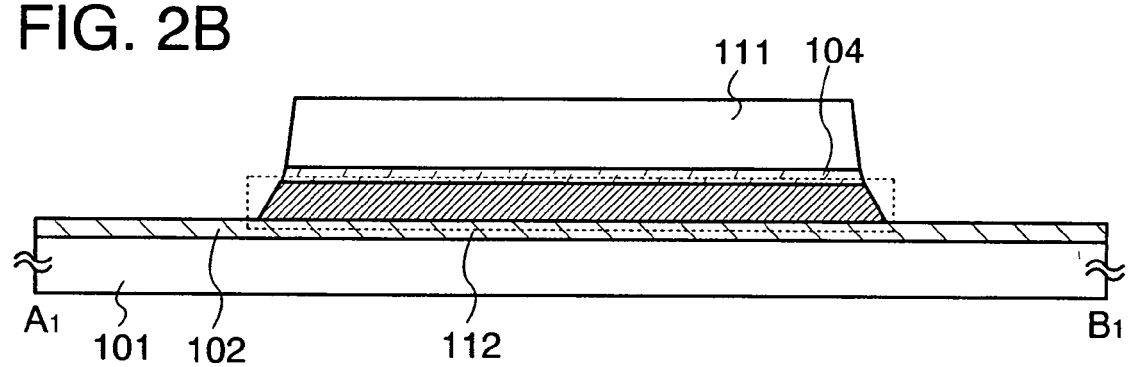
Figure 4B:
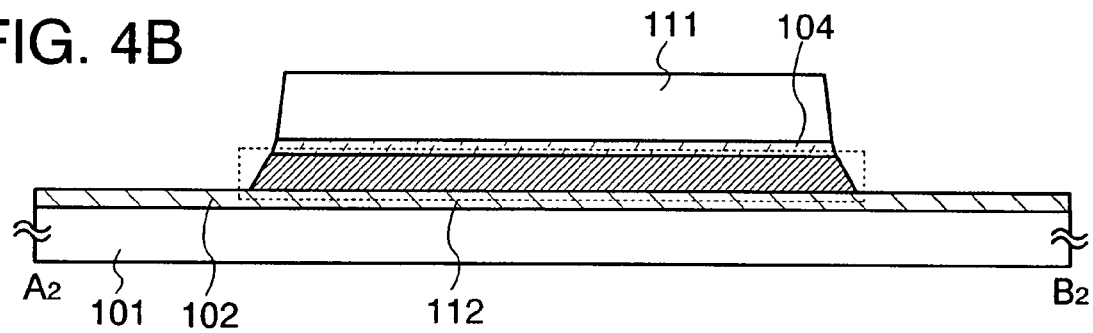
Figure 6B:
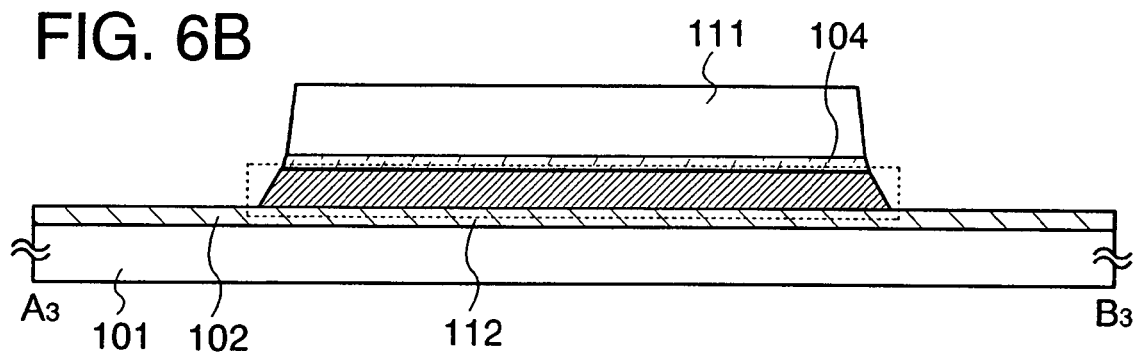

Next, a resist 111 is selectively formed over the semiconductor film 109 (FIGS. 2A, 4A, and 6A). Then, the insulating film 110 and the semiconductor film 109 are dry etched using the resist 111 as a mask, to form an island-shaped semiconductor film 112 and a gate insulating film 104 (FIGS. 2B, 4B, and 6B). Note that as an etching gas for the dry etching, a fluorine-based gas such as $CF_4$, $NF_3$, $SF_6$, $CHF_3$, or $CF_4$, or a mixed gas in which an inert gas such as $O_2$ gas, $H_2$ gas, He, or Ar is suitably added to such a fluorine-based gas, or the like can be used. Preferably, a mixed gas containing $CF_2$ and $O_2$, a mixed gas containing $SF_6$ and $O_2$, a mixed gas containing $CHF_3$ and He, or a mixed gas containing $CF_4$ and $H_2$ is used.

Figure 2C:
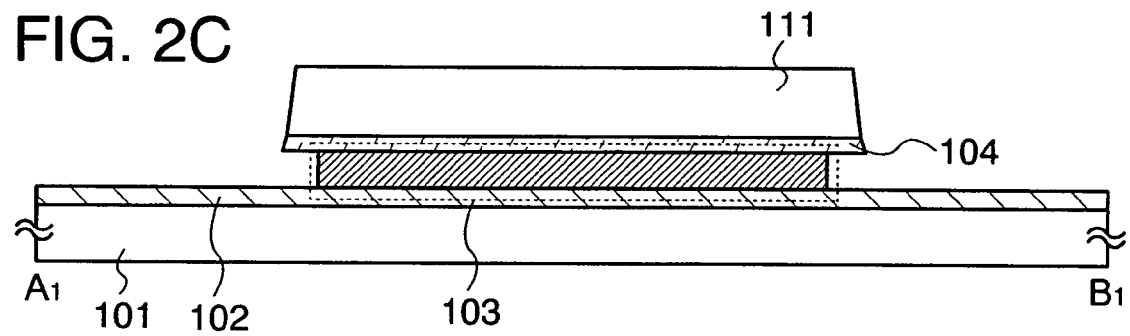
Figure 4C:
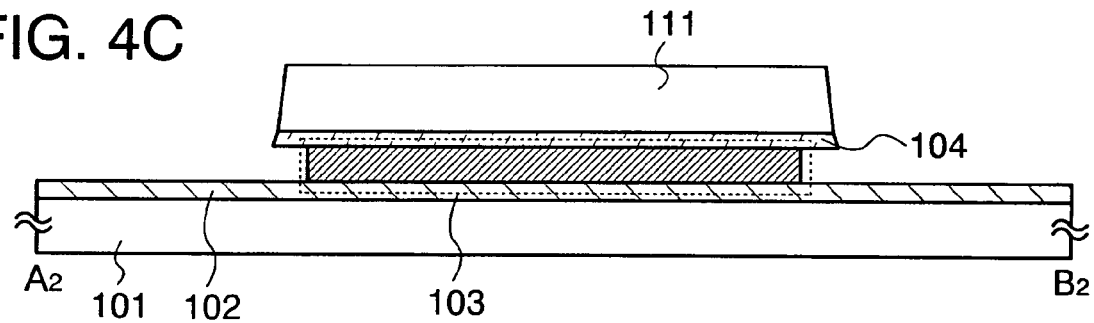
Figure 6C:
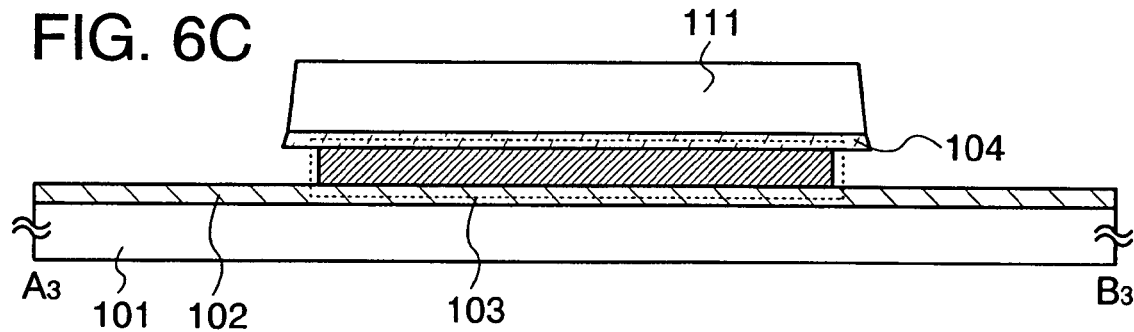

Next, using the resist 111 and the gate insulating film 104 as a mask, the semiconductor film 112 is wet-etched using an organic alkaline solution typified by TMAH (tetramethylammonium hydroxide). An island-shaped semiconductor film 103 disposed in a region inside end portions of the gate insulating film 104 is formed by the wet etching (FIGS. 2C, 4C, and 6C). In the case of using TMAH or the like as an etchant, selective etching takes place with only the semiconductor film 112 being etched, so etching can be conducted without damaging the base insulating film 102 or the gate insulating film 104.

Figure 3A:
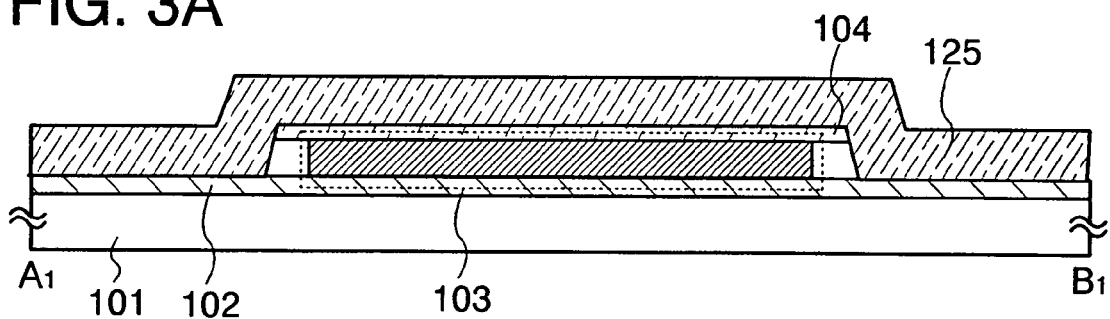
FIGS. 3A to 3C show an example of a manufacturing method of a semiconductor device of the invention.
Figure 5A:
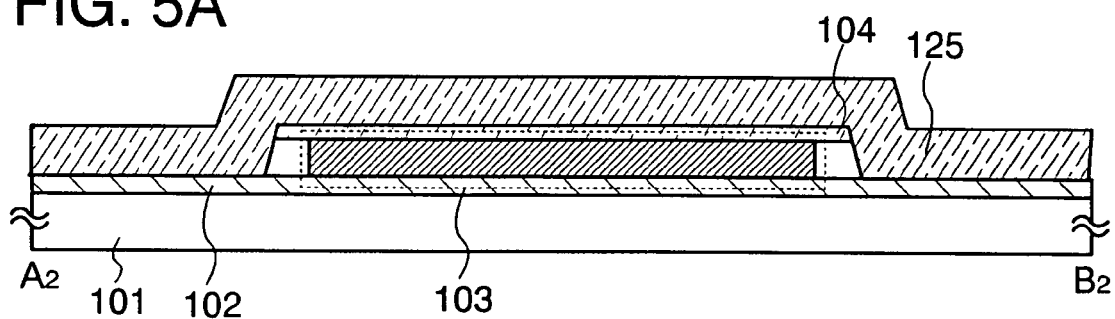
FIGS. 5A to 5C show an example of a manufacturing method of a semiconductor device of the invention.
Figure 7A:
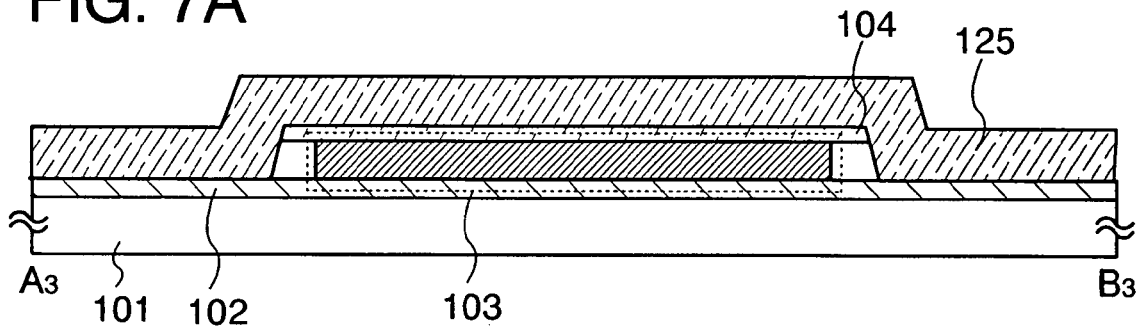
FIGS. 7A to 7C show an example of a manufacturing method of a semiconductor device of the invention.

Next, a conductive film 125 is formed over the gate insulating film 104. An example is shown where the conductive film 125 is formed as a single layer (FIGS. 3A, 5A, and 7A). Of course, the conductive film 125 may also have a stacked structure including two, three or more layers of conductive material.

The conductive film 125 can be formed using an element such as tantalum (Ta), tungsten (W), titanium (Ti), molybdenum (Mo), aluminum (Al), copper (Cu), chromium (Cr), niobium (Nb), or using an alloy material or a compound material containing one of those elements as a main component. Alternatively, the conductive film 125 can be formed using a semiconductor material typified by polycrystalline silicon, doped with an impurity element such as phosphorus. For example, in a case where the conductive film 125 has a stacked structure including a first conductive film and a second conductive film, tantalum nitride may be used as the first conductive film and tungsten may be used as the second conductive film. Note that the conductive film 125 is not limited to this combination. When the conductive film 125 is formed with a stacked structure, the conductive film 125 can be provided by freely combining the materials described above.

Figure 3B:
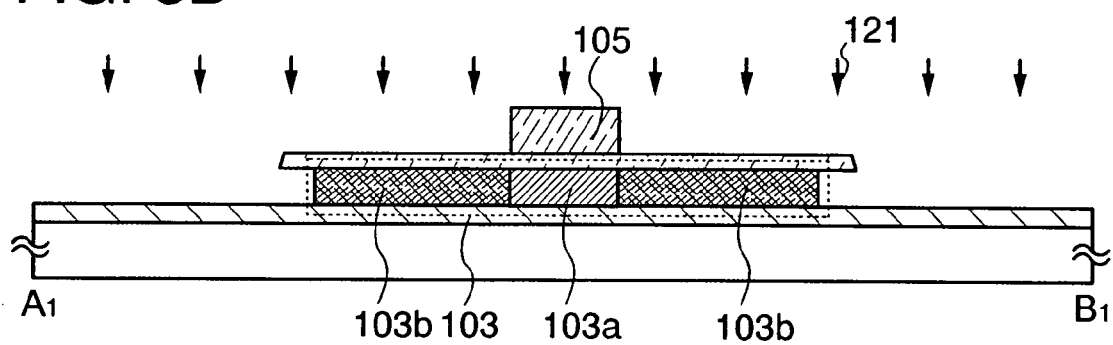
Figure 5B:
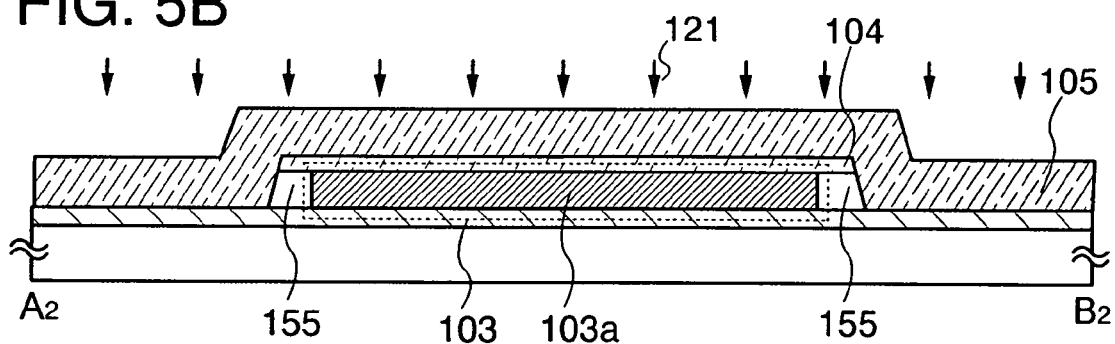
Figure 7B:
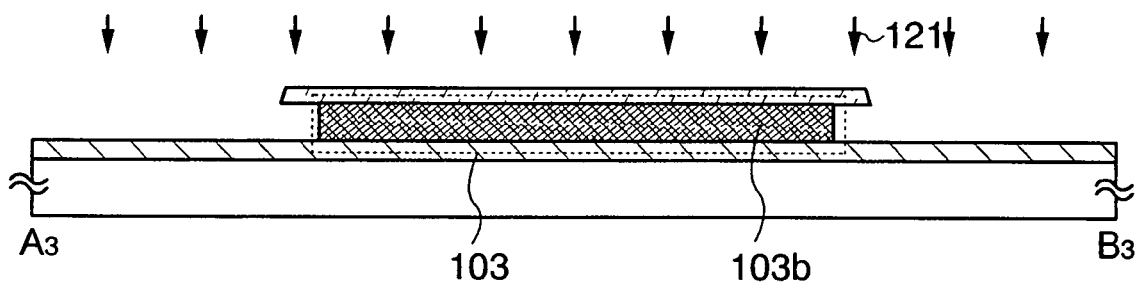

Next, the conductive film 105 that forms a gate electrode is formed by selectively etching the conductive film 125 (FIGS. 3B, 5B and 7B). Subsequently, by introducing an impurity element 121 into the semiconductor film 103 using the conductive film 105 as a mask, impurity regions 103b and a region 103a into which the impurity element 121 is not introduced are formed in the semiconductor film 103 (FIGS. 3B, 5B, and 7B). Note that the region 103a is a region which serves as a channel forming region. Thus, the space 155 which is enclosed by the insulating film 102, side surfaces of the channel forming region 103a, the gate insulating film 104, and the conductive film 105 that forms a gate electrode is formed (FIG. 5B). Note that here, since the impurity element is introduced after the conductive film 105 is formed so as to partly cover the island-shaped semiconductor film 103, the impurity element is introduced into regions of the semiconductor film 103 which are not covered by the conductive film 105, and thereby impurity regions 103b are formed. In the region of the semiconductor film 103 which is covered by the conductive film 105, the region 103a in which the impurity element 121 is not introduced is formed.

As the impurity element 121, an impurity element that imparts n-type conductivity or an impurity element that imparts p-type conductivity can be used. As an impurity element that exhibits n-type conductivity, phosphorus (P), arsenic (As), or the like can be used. As an impurity element that exhibits p-type conductivity, boron (B), aluminum (Al), gallium (Ga), or the like can be used. For example, as the impurity element 121, phosphorus (P) may be introduced into the semiconductor film 103 such that the concentration of phosphorus (P) in the semiconductor film is $1\times10^{15}$ to $1\times10^{19}/cm^3$, to form the impurity regions 103b having n-type conductivity. Note that between the channel forming region and the source or drain region, a lightly-doped drain region (an LDD region) to which an impurity is added at a lower concentration than to the source or drain region may be formed.

Figure 3C:
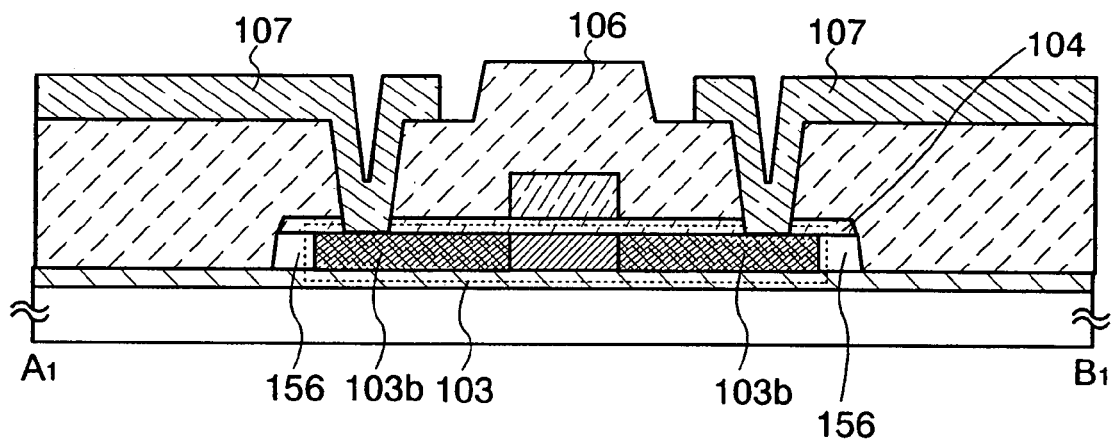
Figure 5C:
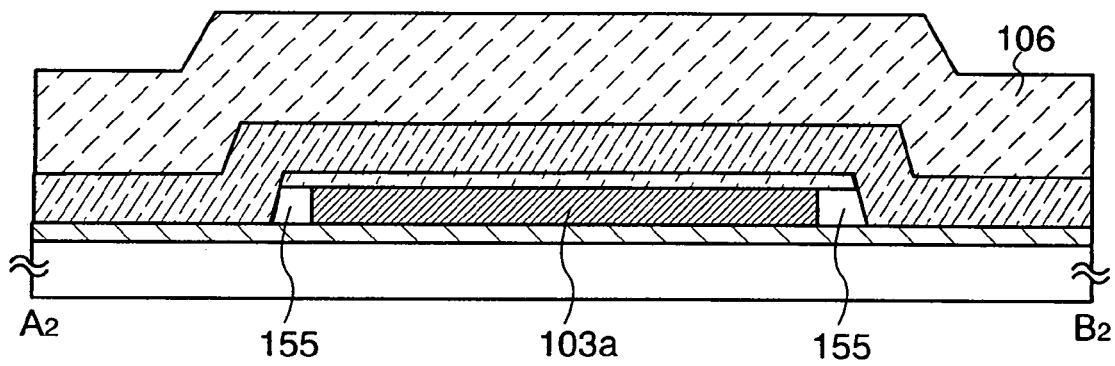
Figure 7C:
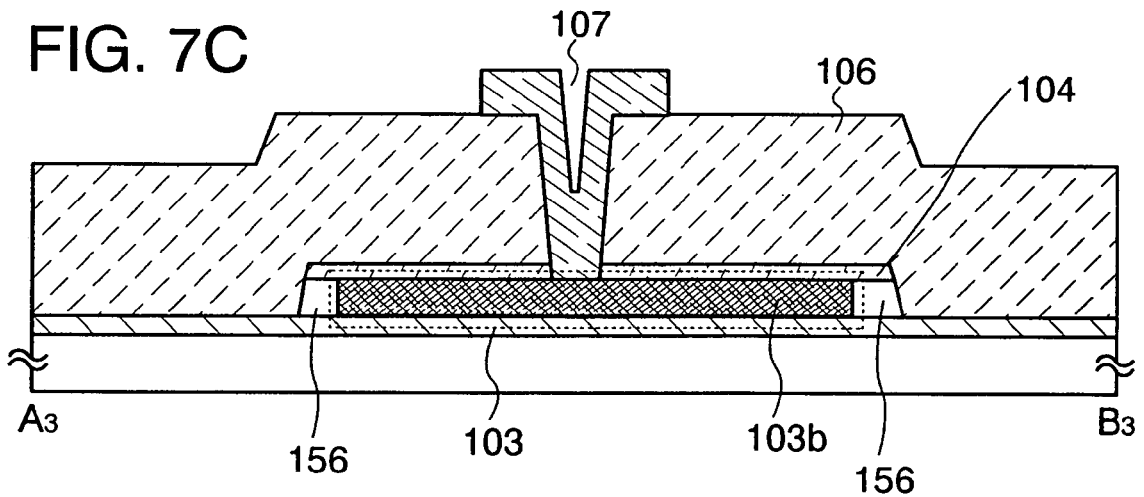

Next, an insulating film 106 is formed so as to cover the conductive film 105, the gate insulating film 104, the insulating film 102, and the like (FIGS. 3C, 5C, and 7C). Subsequently, contact holes are formed in the gate insulating film 104 and the insulating film 106, and conductive films 107 that serve as source electrodes or drain electrodes are selectively formed over the insulating film 106 (FIGS. 3C and 7C). The conductive films 107 are provided so as to be electrically connected with the impurity regions 103b that form source or drain regions of the semiconductor film 103.

Note that in this embodiment mode, the semiconductor film 103 having an island-shape is disposed in a region inside end portions of the gate insulating film 104, and is provided such that the conductive film 105 that forms a gate electrode is not in contact with side surfaces of the channel forming region 103a of the semiconductor film 103. That is, a semiconductor device of this embodiment mode includes the space 155 which is enclosed by the base insulating film 102, side surfaces of the channel forming region 103a of the semiconductor film 103, the gate insulating film 104, and the conductive film 105 that forms a gate electrode (FIG. 5C).

Further, the insulating film 106 is not in contact with side surfaces of the source or drain regions 103b, and a space 156 which is enclosed by the base insulating film 102, side surfaces of the source region or drain region 103b, the gate insulating film 104, and the insulating film 106 is provided (FIGS. 3C and 7C).

As the insulating film 106, silicon oxide, silicon oxynitride ($SiO_xN_y$, where x>y>0), silicon nitride oxide ($SiN_xO_y$, where x>y>0), or the like that is formed by a CVD method, a sputtering method, or the like can be used. Alternatively, the insulating film 106 can be a single layer of an organic material such as polyimide, polyamide, polyvinyl phenol, benzocyclobutene, acrylic, or epoxy; a siloxane material such as a siloxane resin; an oxazole resin; or the like, or can be a stack of layers thereof. Note that a siloxane material corresponds to a material including a Si—O—Si bond. Siloxane is a material having a backbone structure formed of bonds between silicon (Si) and oxygen (O). As a substituent, an organic group containing at least hydrogen (e.g., an alkyl group or an aromatic hydrocarbon) can be used. Alternatively, a fluoro group can be used as a substituent. An oxazole resin is, for example, photosensitive polybenzoxazole, or the like. Photosensitive polybenzoxazole is a material which has a low dielectric constant (a dielectric constant of 2.9 at 1 MHz at room temperature), high heat resistance (according to results of thermogravimetry-differential thermal analysis (TG-DTA), has a thermal decomposition temperature of 550° C. at a rate of temperature increase of 5° C./min), and a low water absorption percentage (0.3% at room temperature over 24 hours). Compared to a relative dielectric constant of polyimide or the like (approximately 3.2 to 3.4), an oxazole resin has a lower dielectric constant (approximately 2.9). Therefore, when an oxazole resin is used, generation of parasitic capacitance can be suppressed and high-speed operation is possible. Here, as the insulating film 106, a single layer or stacked layers of silicon oxide, silicon oxynitride ($SiO_xN_y$, where x>y>0), or silicon nitride oxide ($SiN_xO_y$, where x>y>0) formed by a CVD method is provided. Alternatively, the insulating film 106 may be formed as stacked layers of an organic material such as polyimide, polyamide, polyvinyl phenol, benzocyclobutene, acrylic, or epoxy; a siloxane material such as a siloxane resin; or an oxazole resin.

As the conductive film 107, a single layer or stacked layers formed from one of the elements aluminum, tungsten, titanium, tantalum, molybdenum, nickel, and neodymium or from an alloy containing a plurality of those elements can be used. For example, as a conductive film formed using an alloy containing a plurality of the elements, an aluminum alloy containing titanium, an aluminum alloy containing neodymium, or the like can be used. In a case where a stacked structure is employed for the conductive film 107, an aluminum layer or an aluminum alloy layer such those described above may be stacked by being interposed between titanium layers, for example.

Through the above-described steps, the semiconductor device shown in FIGS. 1A to 1D can be manufactured.

Note that a structure may be employed in which end portions of the gate insulating film 104 are in contact with the base insulating film 102, and the space 155 enclosed by the base insulating film 102, side surfaces of the channel forming region 103a of the semiconductor film 103, and the gate insulating film 104 is formed, as shown in FIG. 8B. Further, a structure may be employed in which end portions of the gate insulating film 104 are in contact with the base insulating film 102, and the space 156 enclosed by the base insulating film 102, side surfaces of the source or drain region 103b of the semiconductor film 103, and the gate insulating film 104 is formed, as shown in FIGS. 8A and 8C.

In the semiconductor device described in this embodiment mode, side surfaces of the channel forming region of the semiconductor film include a region which is not in contact with the gate insulating film or the gate electrode. Therefore, the extent to which insufficient coverage by the gate insulating film adversely affects the semiconductor device can be reduced. That is, since the side surfaces of the channel forming region of the semiconductor film are not in contact with the gate insulating film, electric field concentration does not occur, gate leakage faults are reduced, and the withstand voltage of the gate electrode can be improved.

Embodiment Mode 2

In this embodiment mode, a semiconductor device and a method of manufacturing the semiconductor device which differ to those in the previous embodiment mode will be described, with reference to the drawings. Specifically, a case where the semiconductor device includes a plurality of transistors having differing conductivity types will be described. Further, a case where a semiconductor film and a gate insulating film are formed using a different manufacturing process to the one described in Embodiment Mode 1 will be described.

Figure 9A:
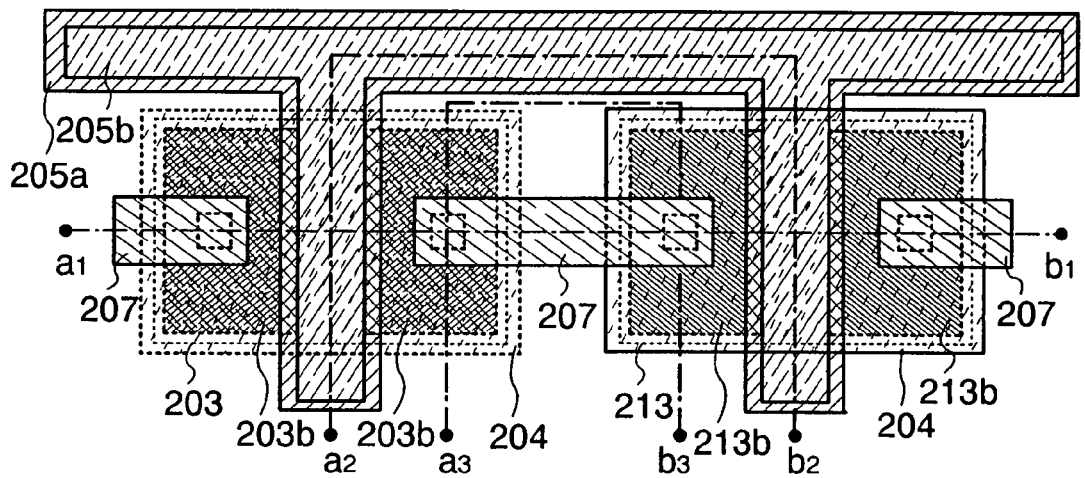
FIGS. 9A to 9D show an example of a semiconductor device of the invention.
Figure 9B:
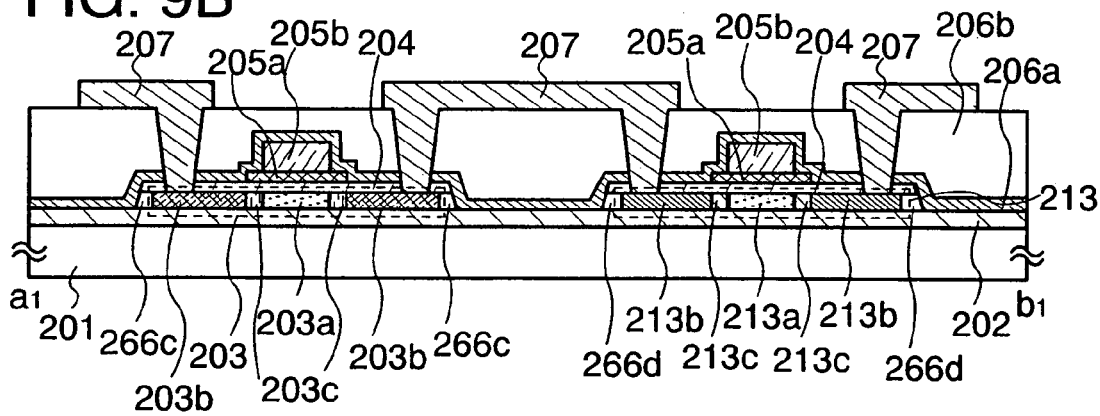
Figure 9C:
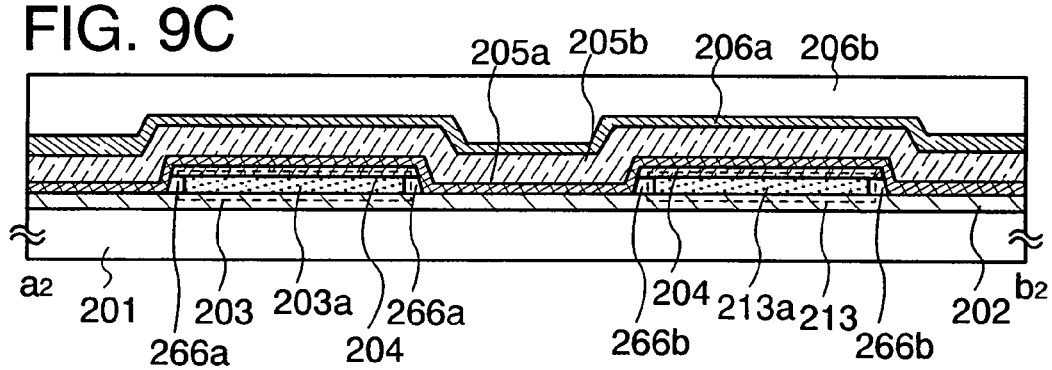
Figure 9D:
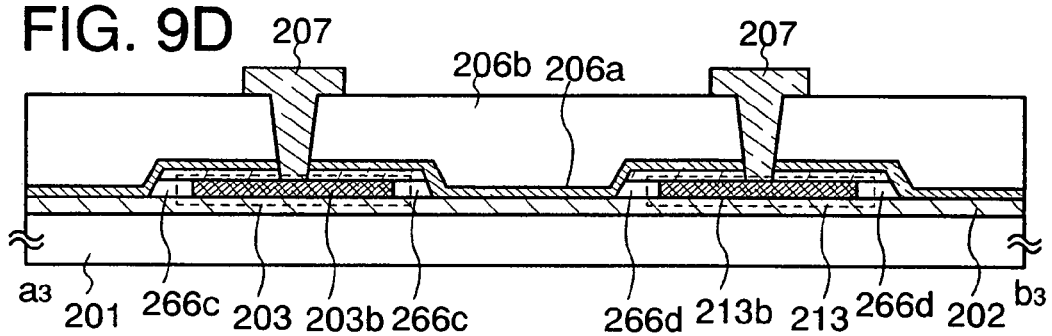

The semiconductor device described in this embodiment mode is shown in FIGS. 9A to 9D. Note that FIG. 9A shows a top view of the semiconductor device described in this embodiment mode, FIG. 9B shows a cross section taken along the broken line joining $a_1$ and $b_1$ in FIG. 9A, FIG. 9C shows a cross section taken along the broken line joining $a_2$ and $b_2$ in FIG. 9A, and FIG. 9D shows a cross section taken along the broken line joining $a_3$ and $b_3$ in FIG. 9A.

The semiconductor device described in this embodiment mode includes semiconductor films 203 and 213 each having an island shape that are provided over a substrate 201 with an insulating film 202 interposed therebetween, conductive films (hereinafter also referred to as gate electrodes) 205a and 205b which form gate electrodes, that are provided over the semiconductor films 203 and 213 with a gate insulating film 204 interposed therebetween, insulating films 206a and 206b that are provided over the semiconductor films 203 and 213 so as to cover the conductive films 205a and 205b, and conductive films 207 which form source or drain electrodes, that are provided over the insulating films 206a and 206b (FIGS. 9A to 9D). Note that the semiconductor film 203 includes a channel forming region 203a, source and drain regions (hereinafter also referred to as impurity regions) 203b, and LDD regions (hereinafter also referred to as impurity regions) 203c. Further, the semiconductor film 213 includes a channel forming region 213a, source and drain regions (hereinafter also referred to as impurity regions) 213b, and LDD regions (hereinafter also referred to as impurity regions) 213c.

Further, in this embodiment mode, the island-shaped semiconductor films 203 and 213 are each disposed in regions inside the gate insulating films 204. Further, the conductive films 205a and 205b that form gate electrodes are provided such that they are not in contact with side surfaces of the channel forming region 203a of the semiconductor film 203. The conductive films 205a and 205b that form gate electrodes are provided such that they are not in contact with side surfaces of the channel forming region 213a of the semiconductor film 213. That is, the semiconductor device of this embodiment mode includes a space 266a that is enclosed by the insulating film 202, side surfaces of the channel forming region 203a, the gate insulating film 204, and the conductive film 205a that forms a gate electrode (FIG. 9C). Further, the semiconductor device of this embodiment mode includes a space 266b that is enclosed by the insulating film 202, side surfaces of the channel forming region 213a, the gate insulating film 204, and the conductive film 205a that forms a gate electrode (FIG. 9C). Note that a structure in which end portions of the gate insulating film 204 are in contact with the insulating film 202 and the gate insulating film 204 is formed so as not to be in contact with side surfaces of the channel forming regions 203a and 213a may also be employed. In that case, the space 266a is a region enclosed by the insulating film 202, side surfaces of the channel forming region 203a of the semiconductor film 203, and the gate insulating film 204, and the space 266b is a region enclosed by the insulating film 202, side surfaces of the channel forming region 213a of the semiconductor film 213, and the gate insulating film 204.

Further, the insulating film 206a is formed so as not to be in contact with side surfaces of the source or drain regions 203b, so a space 266c that is enclosed by the insulating film 202, side surfaces of the source or drain region 203b, the gate insulating film 204, and the insulating film 206a is formed (FIGS. 9B and 9D). Furthermore, the insulating film 206a is formed so as not to be in contact with side surfaces of the source or drain regions 213b, so a space 266d that is enclosed by the insulating film 202, side surfaces of the source or drain region 213b, the gate insulating film 204, and the insulating film 206a is formed (FIGS. 9B and 9D). Note that end portions of the gate insulating film 204 may be formed so as to be in contact with the insulating film 202. In that case, the space 266c is a region enclosed by the insulating film 202, side surfaces of the source or drain region 203b, and the gate insulating film 204, and the space 266d is a region enclosed by the insulating film 202, side surfaces of the source or drain region 213b, and the gate insulating film 204.

The conductive films 205a and 205b that form gate electrodes are provided so as to partially cover the island-shaped semiconductor films 203 and 213. Namely, the conductive films 205a and 205b are provided so as to cover the channel forming regions 203a and 213a. In this embodiment mode, the first conductive film 205a, which is formed below the second conductive film 205b, is formed so as to be wider than the second conductive film 205b.

The semiconductor film 203 formed with an island-shape includes a channel forming region 203a provided in a region that overlaps with the conductive films 205a and 205b with the gate insulating film 204 interposed therebetween. Further, the semiconductor film 203 includes impurity regions 203c that overlap with the conductive film 205a and do not overlap with the conductive film 205b, and are adjacent to the channel forming region 203a. Further, the semiconductor film 203 includes impurity regions 203b that form source or drain regions, which do not overlap with the conductive films 205a and 205b and are provided adjacent to the impurity regions 203c. Note that the impurity regions 203 form lightly doped drain regions (LDD regions) that are doped with an impurity at a lower concentration than the impurity regions 203b. By forming the impurity regions 203c that form LDD regions in regions that overlap with the first conductive film 205a and do not overlap with the second conductive film 205b, on-state current characteristics of a transistor can be improved.

The semiconductor film 213 formed with an island-shape includes a channel forming region 213a provided in a region that overlaps with the conductive films 205a and 205b with the gate insulating film 204 interposed therebetween. Further, the semiconductor film 213 includes impurity regions 213c that overlap with the conductive film 205a and do not overlap with the conductive film 205b, and are adjacent to the channel forming region 213a. Further, the semiconductor film 213 includes impurity regions 213b that form source or drain regions, which do not overlap with the conductive films 205a and 205b and are provided adjacent to the impurity regions 213c. Note that the impurity regions 213 form lightly doped drain regions (LDD regions) that are doped with an impurity at a lower concentration than the impurity regions 213b. By forming the impurity regions 213c that form LDD regions in regions that overlap with the first conductive film 205a and do not overlap with the second conductive film 205b, on-state current characteristics of a transistor can be improved.

In this embodiment mode, the impurity regions 203b and 203c formed in the semiconductor film 203 are formed such that they are impurity regions with a different conductivity type to the impurity regions 213b and 213c formed in the semiconductor film 213. For example, a structure can be employed in which the impurity regions 203b which form source or drain regions of the semiconductor film 203 have p-type conductivity, the impurity regions 203c which form LDD regions have p-type conductivity at a lower concentration than the impurity regions 203b, the impurity regions 213b which form source or drain regions of the semiconductor film 213 have n-type conductivity, and the impurity regions 213c which form LDD regions have n-type conductivity at a lower concentration than the third impurity regions 213b. Note that in the case where the impurity regions 203b formed in the semiconductor film 203 are provided with n-type conductivity, the conductivity types may be reversed.

The conductive films 207 which form source or electrodes are provided so as to be electrically connected with the impurity regions 203b that form source or drain regions of the semiconductor film 203 and with the impurity regions 213b that form source or drain regions of the semiconductor film 213, via openings formed in the insulating films 206a and 206b. Further, as shown in FIGS. 9A to 9D, by electrically connecting the conductive film 207 which is electrically connected to the impurity region 203b that forms a source region or a drain region to the conductive film 207 which is electrically connected to the impurity region 213b that forms a source region or a drain region, a CMOS circuit may be formed.

Next, an example of a method of manufacturing the semiconductor device shown in FIGS. 9A to 9D will be described with reference to the drawings. Note that FIGS. 10A to 10E and 11A to 11D show cross-sections taken along the broken line that joins $a_1$ and $b_1$ in FIG. 9A.

Figure 10A:
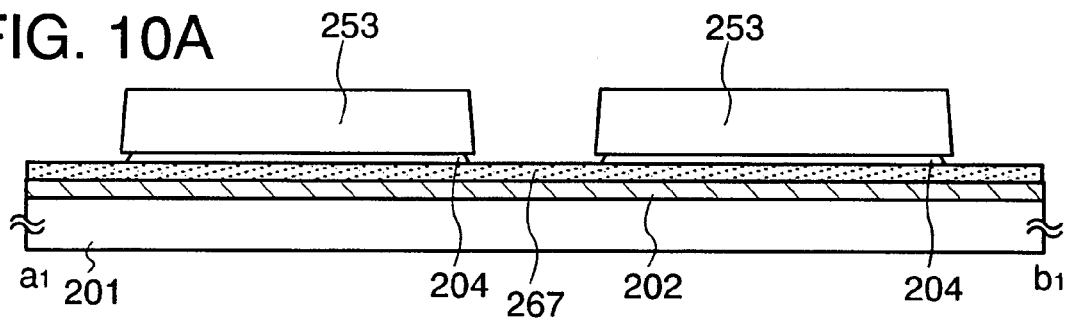
FIGS. 10A to 10E show an example of a manufacturing method of a semiconductor device of the invention.

First, a semiconductor film 267 formed over the substrate 201 with the insulating film 202 interposed therebetween and the gate insulating film 204 that covers the semiconductor film 267 are formed (FIG. 10A). The gate insulating film 204 is formed by forming a resist 253 over an insulating film that is formed over the semiconductor film and wet-etching the insulating film using the resist 253 as a mask. In this embodiment mode, for the substrate 201, the insulating film 202, the semiconductor film 267, and the gate insulating film 204, the same manufacturing methods, materials, and the like as those used for the substrate 101, the insulating film 102, the semiconductor film 103, and the gate insulating film 104, respectively, described in Embodiment Mode 1, can be employed.

Figure 10B:
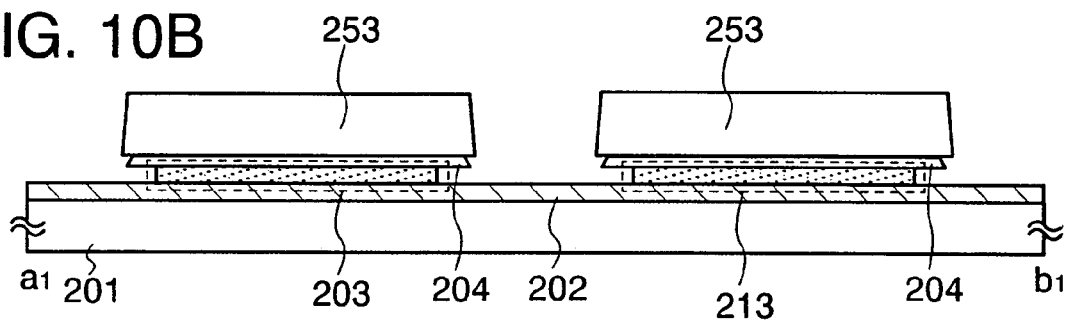

Next, using the resist 253 as a mask, the semiconductor film 267 is wet-etched using TMAH. By wet-etching using TMAH, island-shaped semiconductor films 203 and 213 whose end portions are disposed in regions inside the gate insulating film 204 are formed (FIG. 10B). When TMAH or the like is used as an etchant, selective etching takes place with only the semiconductor film 267 being etched, so the insulating film 202 and the gate insulating film 204 are not unnecessarily etched. Note that the invention is of course not limited to the manufacturing method described in this embodiment mode. The semiconductor films 203 and 213 and the gate insulating film 204 may be formed by dry-etching the semiconductor film and the gate insulating film simultaneously, then wet etching the semiconductor films so they recede back inside the regions of the gate insulating films 204, as shown in Embodiment Mode 1.

Further, in order to control a threshold value or the like, an impurity element may be introduced into the semiconductor films 203 and 213 in advance at a low concentration. In that case, an impurity element is also introduced into regions which are to later be channel forming regions in the semiconductor films 203 and 213. As an impurity element, an impurity element which imparts n-type conductivity or an impurity element which imparts p-type conductivity can be used. As an impurity element exhibiting n-type conductivity, phosphorus (P), arsenic (As), or the like can be used. As an impurity element exhibiting p-type conductivity, boron (B), aluminum (Al), gallium (Ga), or the like can be used. For example, as the impurity element, boron (B) can be introduced in advance into an entire surface of the semiconductor film 203 and an entire surface of the semiconductor film 213 such that it is contained in the semiconductor films 203 and 213 at a concentration of $5\times10^{15}$ to $5\times10^{17}/cm^3$. Of course, the concentration at which an impurity element or impurity elements are introduced into the semiconductor films 203 and 213 may differ, and an impurity element introduced into the semiconductor film 203 may have a different conductivity type to that of an impurity element introduced into the semiconductor film 213.

Next, the resist 253 is removed, and a first conductive film 255a and a second conductive film 255b that form gate electrodes are formed over the gate insulating film 204. The first conductive film 255a may be formed with a thickness of approximately 5 to 50 nm, and the second conductive film 255b may be formed with a thickness of approximately 150 to 500 nm. As the first conductive film 255a, an aluminum (Al) film, a copper (Cu) film, a film that has aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used. As the second conductive film 255b, for example, a chromium (Cr) film, a tantalum (Ta) film, a film that has tantalum as a main component, a tungsten (W) film, a titanium (Ti) film, an aluminum (Al) film, or the like can be used. However, it is necessary for the first conductive film 255a and the second conductive film 255b to be a combination from which a selective ratio can be obtained when they are being etched. As a combination of the first conductive film and the second conductive film from which a selective ratio can be obtained, for example, a combination of a first conductive film 255a formed of Al and a second conductive film 255b formed of Ta, a first conductive film 255a formed of Al and a second conductive film 255b formed of Ti, or a first conductive film 255a formed of TaN and a second conductive film 255b formed of W, or the like can be used.

Figure 10C:
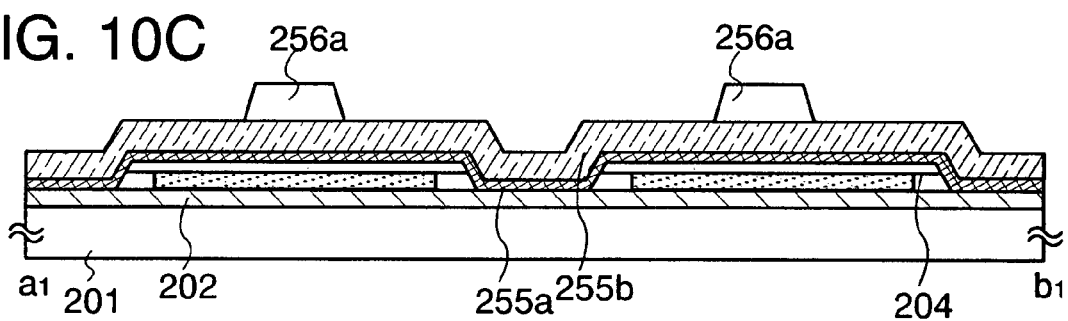

Next, a first resist 256a is formed over the second conductive film 255b using a photolithography technique (FIG. 10C). The first resist 256a may be formed with tapered side surfaces. By giving the first resist 256a a tapered shape, in the first etching which follows, an etched second conductive film 255c that has a tapered shape can be formed. Further, by giving side surfaces of the first resist 256a a tapered shape, a reaction product in the first etching can be prevented from adhering to the side surfaces of the first resist 256a and growing. Moreover, a first resist 256a whose cross-sectional shape is bilaterally symmetrical and which has two side surfaces with the same tapered shape may be formed by thermally treating the first resist 256a.

Figure 10D:
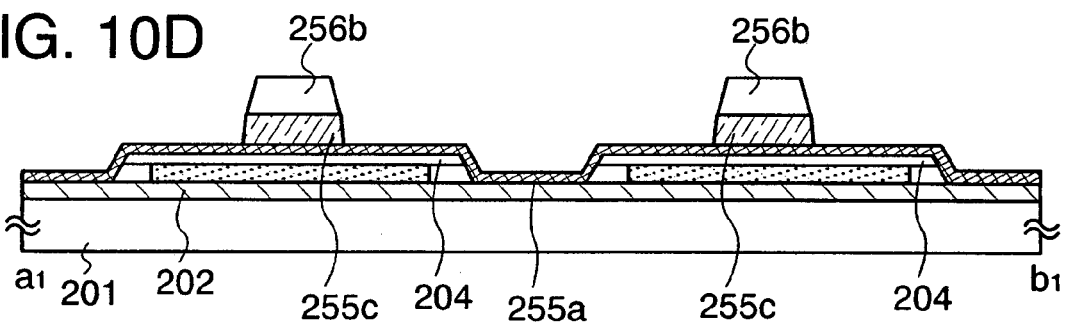

Next, the first etching is conducted using the first resist 256a as a mask (FIG. 10D). In the first etching, the second conductive film 255b is etched, forming the etched second conductive film 255c. It is preferable to conduct the etching with etching conditions in which there is a high selective ratio with respect to the first conductive film 255a, so that the first conductive film 255a is not etched. Note that the first resist 256a is also etched, and becomes a second resist 256b. However, in the drawings, the recession in width of the first resist 256a that occurs when it is etched to form the second resist 256b is not shown. Note that in the first etching, a mixed gas containing $Cl_2$, $SF_6$, and $O_2$ may be used as an etching gas.

Figure 10E:
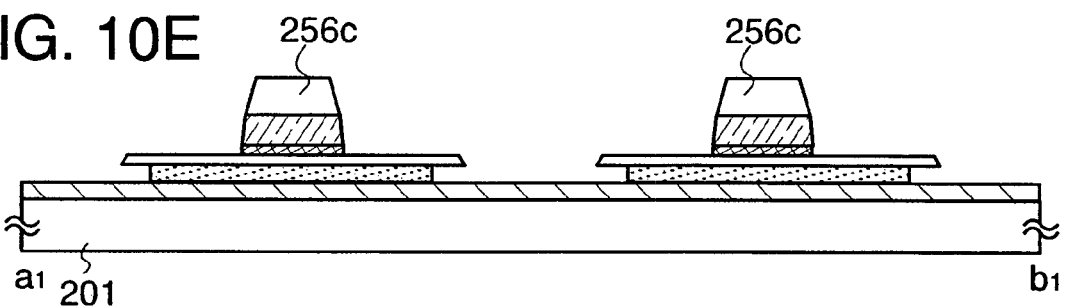

Next, the first conductive film 255a is etched in a second etching using the etched second conductive film 255c as a mask (FIG. 10E). By the second etching, a first gate electrode 205a is formed from the first conductive film 255a. It is preferable to conduct the etching with etching conditions in which there is a high selective ratio with respect to the gate insulating film 204, so that the gate insulating film 204 is not etched. In the second etching, $Cl_2$ may be used as an etching gas. Note that the second resist 256b is also etched and recedes, forming a third resist 256c; however, the recession is not shown in the drawings.

Figure 11A:
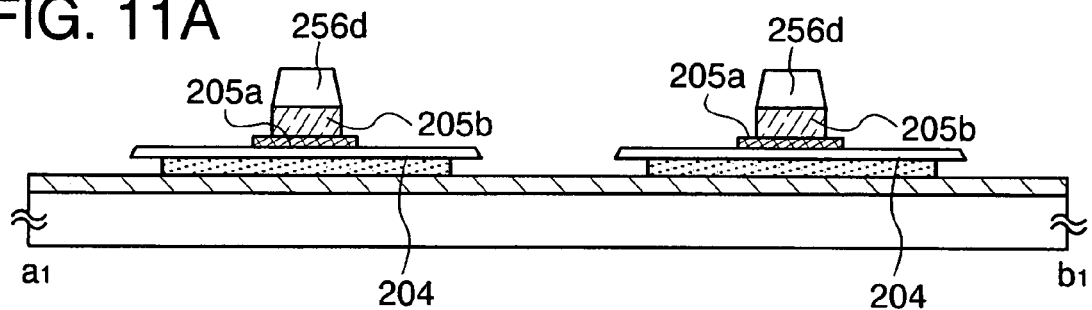
FIGS. 11A to 11D show an example of a manufacturing method of a semiconductor device of the invention.

Next, a third etching is conducted, causing the third resist 256c to recede (FIG. 11A). At the same time, using the third resist 256c which is receding as a mask, the etched second conductive film 255c is shortened in a channel length direction, forming a second gate electrode 205b. Note that the receded third resist 256c becomes a fourth resist 256d. Subsequently, the fourth resist 256d is removed. As an etching gas for the third etching, a mixed gas containing $Cl_2$, $SF_6$, and $O_2$ may be used.

The first to third etchings of this embodiment mode can be dry etchings. Etching can be conducted using an ICP (inductively coupled plasma) etching method.

Figure 11B:
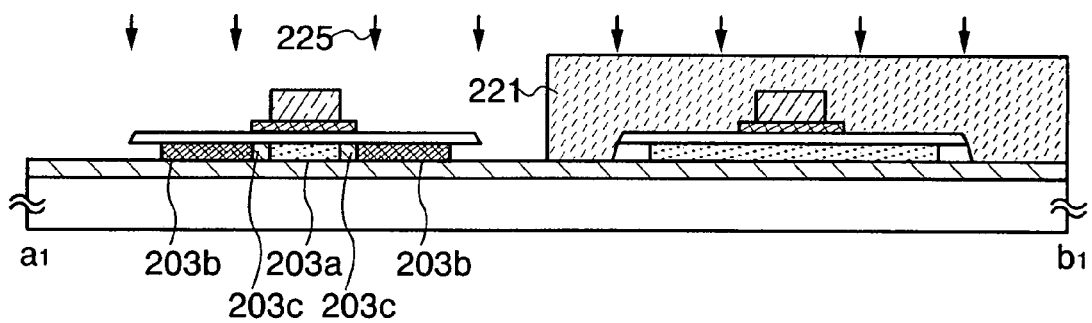

Next, the island-shaped semiconductor film 203 is doped with an impurity element 225 (FIG. 11B). After selectively providing a resist 221 over the semiconductor film 213, the impurity element 225 is introduced into the semiconductor film 203 using the resist 221 and the second gate electrode as masks (FIG. 11B). By doing this, impurity regions 203c are formed in sections of the island-shaped semiconductor film that overlap with the first gate electrode 205a and do not overlap with the second gate electrode 205b. Further, at the same time, impurity regions 203b are formed in sections of the island-shaped semiconductor film that do not overlap with the first gate electrode 205a or the second gate electrode 205b. Note that the impurity regions 203b formed at both end portions of the semiconductor film 203 serve as source or drain regions, and the impurity regions 203c provided adjacent to the impurity regions 203b are regions to which an impurity is added at lower concentration than the impurity regions 203b, and serve as LDD regions. Further, a region 203a sandwiched by the impurity regions 203c that serve as LDD regions serves as a channel forming region. As a doping method, an ion doping method, an ion implantation method, or the like can be used. For example, when manufacturing a p-type semiconductor, as an impurity element, boron (B), gallium (Ga), or the like may be used, and when manufacturing an n-type semiconductor, phosphorus (P), arsenic (As), or the like may be used. Here, as the impurity element 225, boron (B) is introduced into the semiconductor film 203 such that it is included at a concentration of $1\times10^{19}$ to $1\times10^{20}/cm^3$, forming the impurity regions 203b that exhibit p-type conductivity.

Figure 11C:
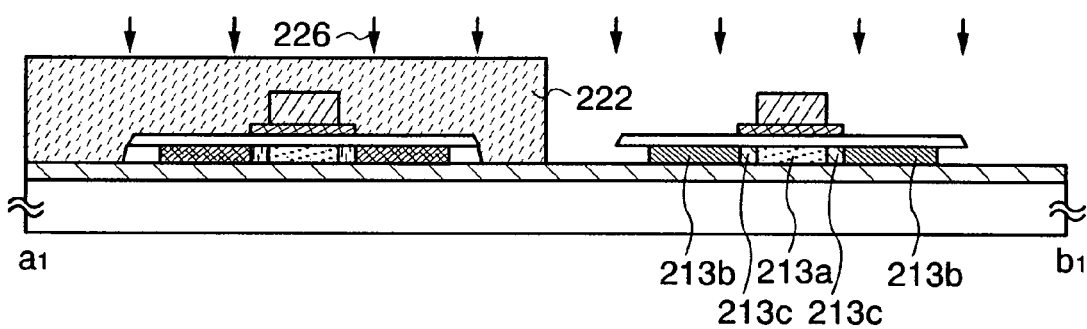

Next, after selectively providing a resist 222 so as to cover the entire surface of the semiconductor film 203, a channel forming region 213a, the impurity regions 213b, and the impurity regions 213c are formed in the semiconductor film 213 by introducing an impurity element 226 into the semiconductor film 213 using the conductive film 205a and the conductive film 205b, which are formed over the semiconductor film 213, as a mask (FIG. 11C). The channel forming region 213a is formed in a region where the first gate electrode 205a, the second gate electrode 205b, and the semiconductor film 213 overlap. The impurity regions 213c which serve as LDD regions are formed in regions which are adjacent to the channel forming region 213a and in which the first gate electrode 205a and the semiconductor film 213 overlap. The impurity regions 213b which serve as source or drain regions are each formed adjacent to an impurity region 213c. Note that here, the impurity regions 213c are regions where an impurity is added at a lower concentration than the impurity regions 213b.

As the impurity element 226, an impurity element which imparts n-type conductivity or an impurity element which imparts p-type conductivity can be used. As an impurity element which exhibits n-type conductivity, phosphorus (P), arsenic (As), or the like can be used. As an impurity element which exhibits p-type conductivity, boron (B), aluminum (Al), gallium (Ga), or the like can be used. Further, in this embodiment mode, as the impurity element 226, an impurity element that has a different conductivity type to the impurity element 225 is used. Here, as the impurity element 226, phosphorus (P) is introduced into the semiconductor film 213 such that it is included at a concentration of $1\times10^{19}$ to $1\times10^{20}/$ cm$^3$, forming the third impurity regions 213b which exhibit n-type conductivity.

Further, in this embodiment mode, the order in which the impurity element 225 and the impurity element 226 are introduced into the semiconductor films 203 and 213 may be reversed.

Figure 11D:
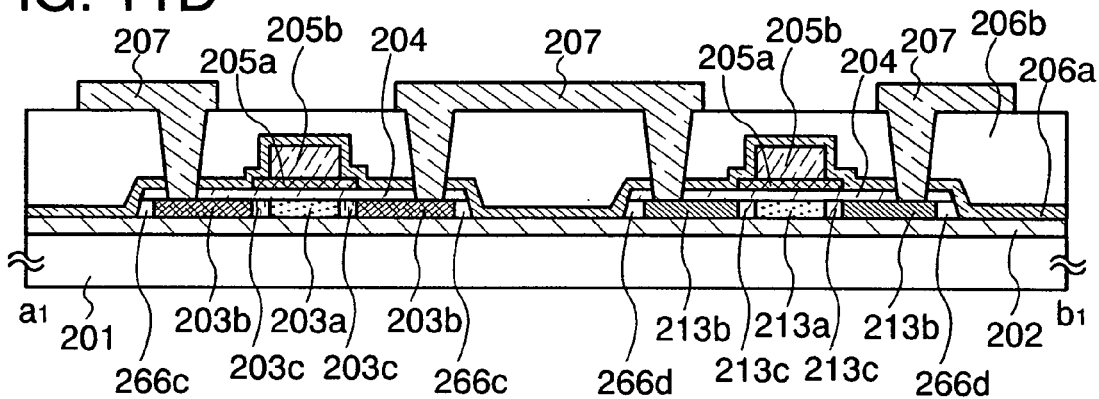

Next, the insulating film 206a and the insulating film 206b are stacked so as to cover the first gate electrode 205a, the second gate electrode 205b, the semiconductor films 203 and 213, and the like, and conductive films 207 which serve as source or drain electrodes are selectively formed over the insulating film 206b (FIG. 11D). The conductive films 207 are provided so as to be electrically connected to the impurity regions 203b which form source or drain regions of the semiconductor film 203 and to the impurity regions 213b which form source or drain regions of the semiconductor film 213. Note that in this embodiment mode, by electrically connecting the conductive film 207 which is electrically connected to the impurity region 203b with the conductive film 207 which is electrically connected to the impurity region 213b, a CMOS circuit including a p-channel thin film transistor and an n-channel thin film transistor can be formed. Here, the insulating film 206a is formed so as not to be in contact with side surfaces of the source or drain regions 203b, so a space 266c that is enclosed by the insulating film 202, side surfaces of the source or drain region 203b, the gate insulating film 204, and the insulating film 206a is provided. Further, the insulating film 206a is formed so as not to be in contact with side surfaces of the source or drain regions 213b, so a space 266c that is enclosed by the insulating film 202, side surfaces of the source or drain region 213b, the gate insulating film 204, and the insulating film 206a is provided. Note that end portions of the gate insulating film 204 may be formed so as to be in contact with the insulating film 202.

In this embodiment mode, for the insulating film 206a, the insulating film 206b, and the conductive films 207, the manufacturing methods, materials, and the like described in Embodiment Mode 1 can be employed. Here, as the insulating film 206a, silicon oxide, silicon oxynitride (SiO$_x$N$_y$, where x>y>0), or silicon nitride oxide (SiN$_x$O$_y$, where x>y>0) formed by a CVD method is used, and as the insulating film 206b, an organic material such as polyimide, polyamide, polyvinyl phenol, benzocyclobutene, acrylic, or epoxy, or a siloxane material such as a siloxane resin, or an oxazole resin is used.

Through the above steps, the semiconductor device shown in FIGS. 9A to 9D can be manufactured.

In the semiconductor device described in this embodiment mode, since side surfaces of the channel forming region of the semiconductor film include a region which is not in contact with the gate insulating film or the gate electrode, the extent to which insufficient coverage by the gate insulating film adversely affects the semiconductor device can be reduced. That is, since the side surfaces of the channel forming region of the semiconductor film are not in contact with the gate insulating film, electric field concentration does not occur, gate leakage faults are reduced, and the withstand voltage of the gate electrode can be improved.

Embodiment Mode 3

In this embodiment mode, examples of modes of use for a semiconductor device obtained using the manufacturing methods described in the previous embodiment modes will be described. Specifically, applications of a semiconductor device capable of inputting and outputting data wirelessly will be described, with reference to the drawings. According to its mode of use, a semiconductor device capable of inputting and outputting data wirelessly may also be called an RFID tag, an ID tag, an IC tag, an IC chip, an RF tag, a wireless tag, an electronic tag, or a wireless chip.

First, an example of an upper surface structure of a semiconductor device described in this embodiment mode will be described with reference to FIG. 12A. A semiconductor device 80 shown in FIGS. 12A to 12C includes a thin film integrated circuit 131 including a plurality of elements such as thin film transistors which form memory portions and logic portions, and a conductive film 132 which serves as an antenna. The conductive film 132 which serves as an antenna is electrically connected to the thin film integrated circuit 131.

Further, in a case where the thin film integrated circuit 131 includes thin film transistors, any structure described in the previous embodiment modes can be employed.

Figure 12A:
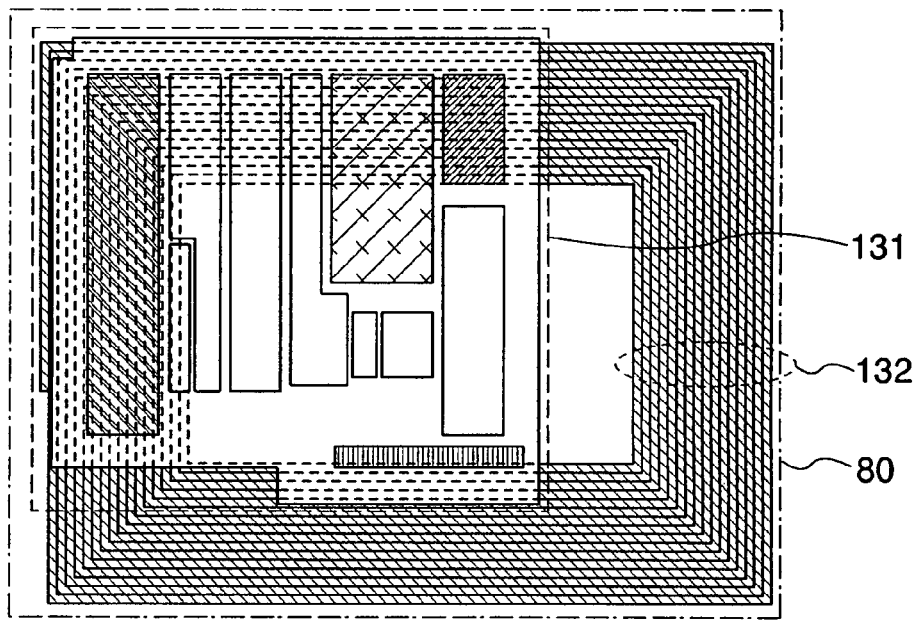
FIGS. 12A to 12C show examples of modes of using a semiconductor device of the invention.
Figure 12B:
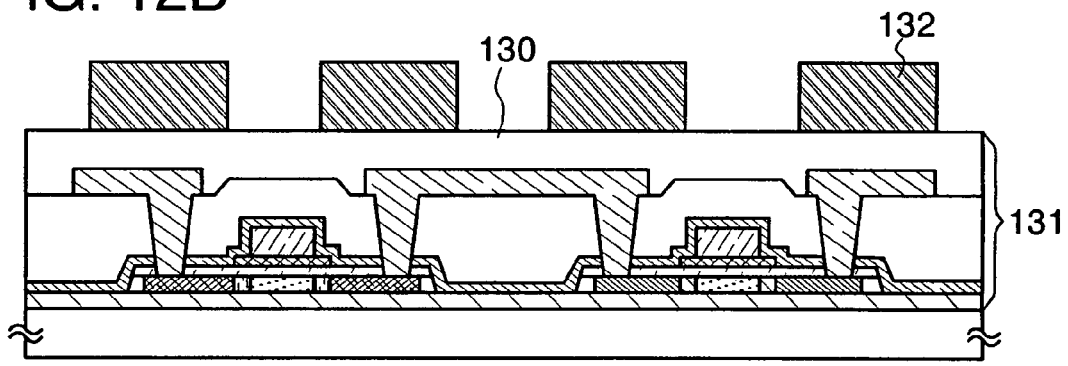
Figure 12C:
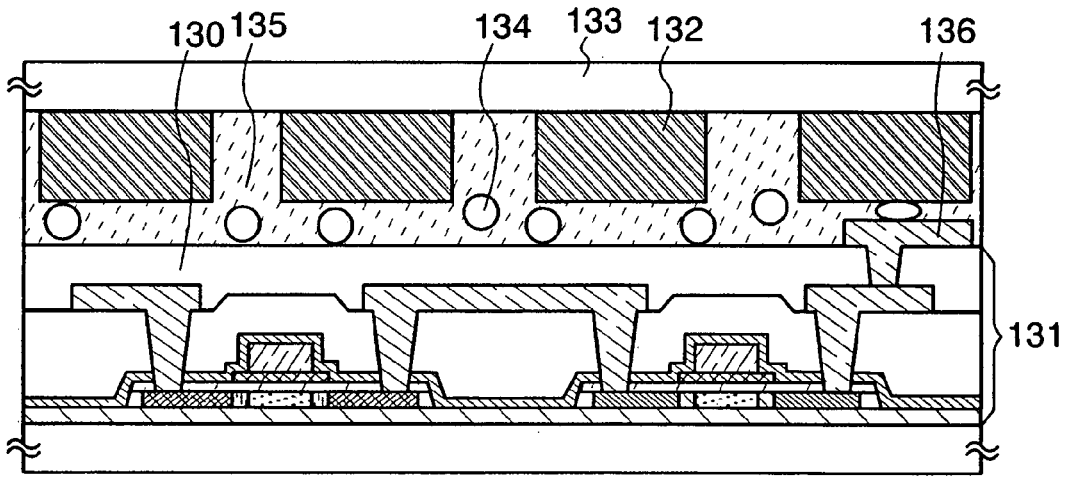

FIGS. 12B and 12C show schematic diagrams of cross sections of FIG. 12A. The conductive film 132 which serves as an antenna may be provided over the elements which form the memory portions and logic portions. For example, the conductive film 132 which serves as an antenna can be provided over any semiconductor device described in the previous embodiment modes, with an insulating film 130 interposed therebetween (FIG. 12B). Alternatively, the conductive film 132 which serves as an antenna can be provided separately over a substrate 133, then attached to the thin film integrated circuit 131 (FIG. 12C). Here, a conductive film 136 provided over the insulating film 130 is electrically connected to the conductive film 132 which serves as an antenna by conductive particles 134 contained in a resin 135 having an adhesive property.

Note that in this embodiment mode, an example is described in which the conductive film 132 which serves as an antenna has a coiled shape and an electromagnetic induction method or an electromagnetic coupling method is employed. However, a semiconductor device of the invention is not limited to this, and a microwave method can also be employed. In the case of employing a microwave method, the form of the conductive film 132 which serves as an antenna may be decided appropriately depending on the wavelength of an electromagnetic wave that is employed.

Figure 13A:
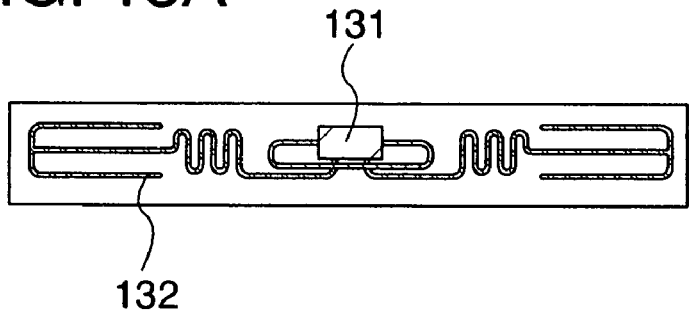
FIGS. 13A to 13D show examples of modes of using a semiconductor device of the invention.
Figure 13B:
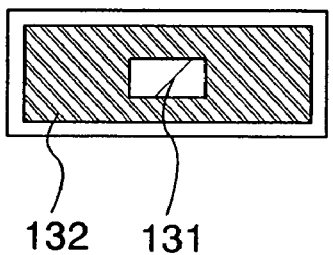
Figure 13C:
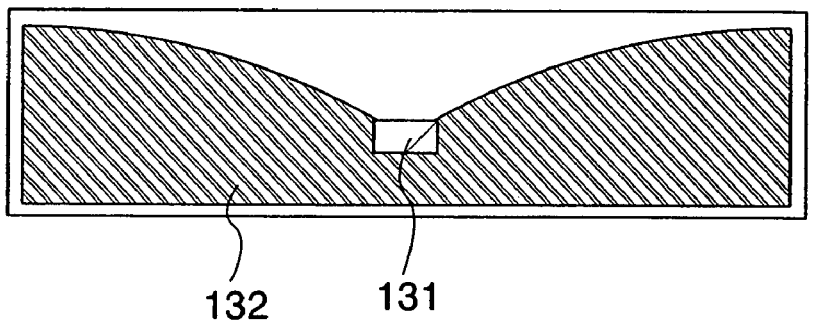
Figure 13D:
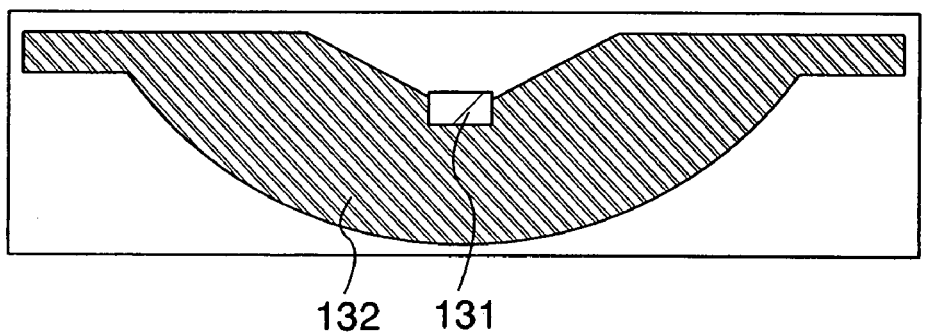

For example, as a signal transmission method for the semiconductor device 80, in the case of employing a microwave method (for example, using a UHF band (an 860 to 960 MHz band), a 2.45 GHz band, or the like), the form, such as the length, of the conductive film which serves as an antenna may be decided appropriately taking the wavelength of an electromagnetic wave used for signal transmission into account. For example, the conductive film which serves as an antenna can be formed with a linear shape (e.g., as a dipole antenna (FIG. 13A)), a flat shape (e.g., as a patch antenna (FIG. 13B)), a ribbon shape (FIGS. 13C and 13D), or the like. Further, the form of the conductive film 132 which serves as an antenna is not limited to a linear form. Taking the wavelength of an electromagnetic wave into consideration, the conductive film 132 may be given a curved form, a meandering form, or a combination of such forms.

The conductive film 132 which serves as an antenna is formed of a conductive material using a CVD method, a sputtering method, a printing method such as screen printing or gravure printing, a droplet discharging method, a dispenser method, a plating method, or the like. The conductive material is formed as a single layer of an element that is any one of aluminum (Al), titanium (Ti), silver (Ag), copper (Cu), gold (Au), platinum (Pt), nickel (Ni), palladium (Pd), tantalum (Ta), and molybdenum (Mo), or of an alloy material or a compound material that has one of those elements as its main component, or as a plurality of layers thereof.

For example, in the case of using a screen printing method to form the conductive film 132 which functions as an antenna, the conductive film 132 can be provided by selectively printing a conductive paste in which a plurality of conductive particles having a grain size of several nm to several tens of μm are dissolved or dispersed in an organic resin. As the conductive particles, metal particles of one or more of any of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersive nanoparticles can be used. In addition, as the organic resin included in the conductive paste, one or more organic resins which function as a binder, a solvent, a dispersing agent, or a coating material for the metal particles can be used. Organic resins such as an epoxy resin or a silicon resin can be given as representative examples. Further, when the conductive film is formed, it is preferable to conduct baking after the conductive paste is applied. For example, in the case of using fine particles containing silver as a main component (e.g., the grain size is in the range of 1 nm to 100 nm, inclusive) as a material for the conductive paste, the conductive film can be obtained by curing by baking at a temperature in the range of 150 to 300° C. Alternatively, fine particles containing solder or lead-free solder as a main component may be used. In that case, preferably, fine particles having a grain size of 20 μm or less are used. Solder and lead-free solder have advantages such as low cost.

Next, an operation of a semiconductor device described in this embodiment mode will be described.

Figure 14A:
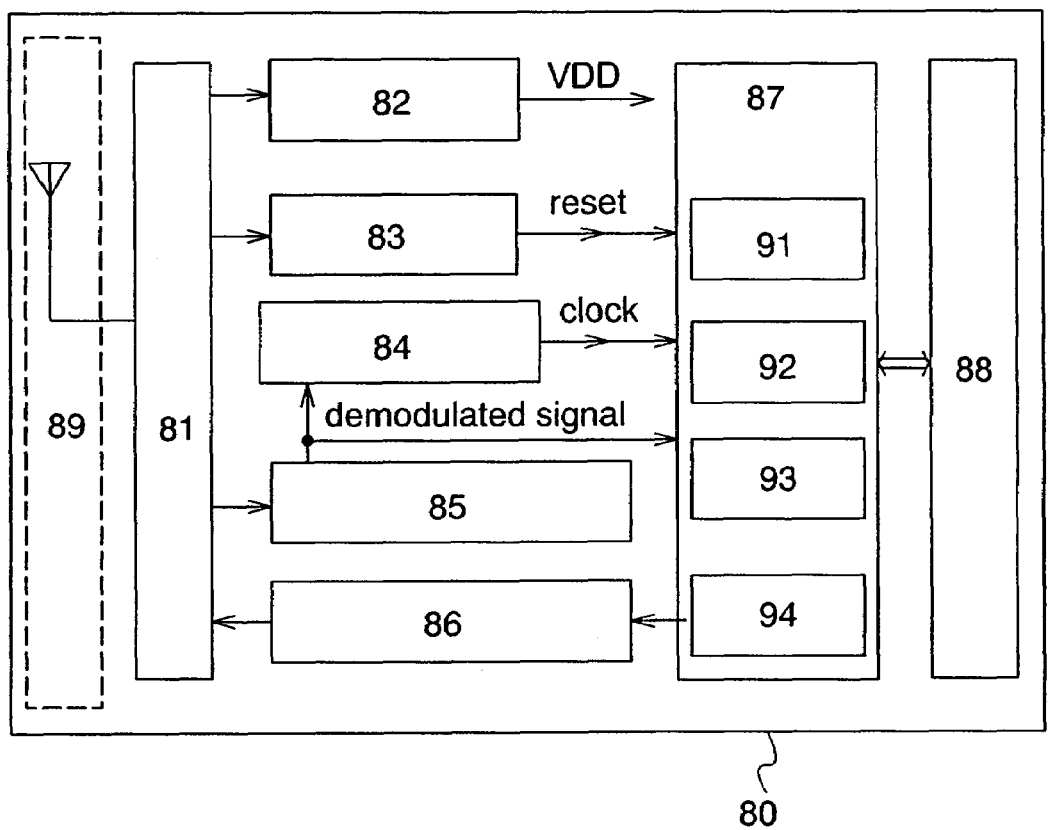
FIGS. 14A to 14C show examples of modes of using a semiconductor device of the invention.

The semiconductor device 80 has a function of exchanging data wirelessly, and includes a high-frequency circuit 81, a power supply circuit 82, a reset circuit 83, a clock generating circuit 84, a data demodulating circuit 85, a data modulating circuit 86, a control circuit 87 which controls another circuit, a storage circuit 88, and an antenna 89 (FIG. 14A). The high-frequency circuit 81 receives a signal from the antenna 89, and outputs a signal, which is received from the data modulating circuit 86, from the antenna 89. The power supply circuit 82 generates a power supply potential from a received signal. The reset circuit 83 generates a reset signal. The clock generating circuit 84 generates various clock signals based on a received signal inputted from the antenna 89. The data demodulating circuit 85 demodulates a received signal and outputs the demodulated signal to the control circuit 87. The data modulating circuit 86 modulates a signal received from the control circuit 87. As the control circuit 87, for example, a code extracting circuit 91, a code determining circuit 92, a CRC determining circuit 93, and an output unit circuit 94 are provided. Note that the code extracting circuit 91 extracts each of plural codes included in an instruction sent to the control circuit 87. The code determining circuit 92 determines the content of the instruction by comparing the extracted code with a code corresponding to a reference. The CRC determining circuit 93 detects whether or not there is a transmission error or the like based on the determined code.

In FIG. 14A, in addition to the control circuit 87, the high-frequency circuit 81, which is an analog circuit, and the power supply circuit 82 are included.

Next, an example of an operation of the aforementioned semiconductor device will be described. First, a radio signal is received by the antenna 89 and sent to the power supply circuit 82 via the high-frequency circuit 81. Thereby, a high power supply potential (hereinafter referred to as VDD) is generated. The VDD is supplied to each circuit in the semiconductor device 80. A signal sent to the data demodulating circuit 85 via the high-frequency circuit 81 is demodulated (hereinafter this signal is referred to as a demodulated signal). Further, signals that have passed through the reset circuit 83 and the clock generating circuit 84 via the high-frequency circuit 81, and the demodulated signal are sent to the control circuit 87. The signals sent to the control circuit 87 are analyzed by the code extracting circuit 91, the code determining circuit 92, the CRC determining circuit 93, and the like. Then, based on the analyzed signals, information of the semiconductor device stored in the storage circuit 88 is outputted. The outputted information of the semiconductor device is encoded by the output unit circuit 94. Further, the encoded information of the semiconductor device 80 is converted to a radio signal by the data modulating circuit 86, and is then sent by the antenna 89. Note that a low power supply potential (hereinafter referred to as VSS) is common in the plural circuits included in the semiconductor device 80, and VSS can be GND.

In this manner, when a signal is sent from a reader/writer to the semiconductor device 80 and a signal sent from the semiconductor device 80 is received by the reader/writer, data of the semiconductor device can be read.

Further, the semiconductor device 80 may be one in which a power supply (e.g., a battery) is not included and power supply voltage is supplied to each circuit by electromagnetic waves. It may also be one in which a power supply (e.g., a battery) is included, and power supply voltage is supplied to each circuit by both electromagnetic waves and the power supply (battery).

Figure 14B:
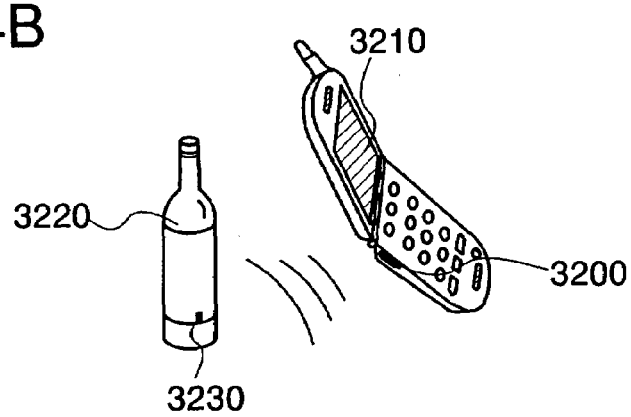
Figure 14C:
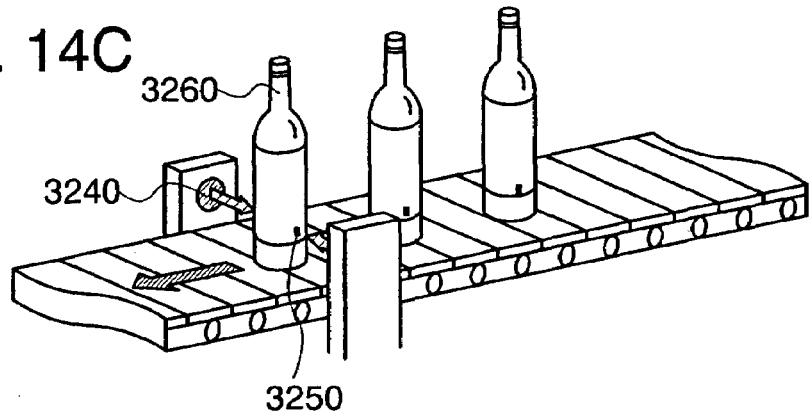

Next, an example of a mode of use of a semiconductor device capable of inputting and outputting data wirelessly will be described. A side surface of a mobile terminal including a display portion 3210 is provided with a reader/writer 3200. A side surface of a product 3220 is provided with a semiconductor device 3230 (FIG. 14B). When the reader/writer 3200 is held over the semiconductor device 3230 included in the product 3220, the display portion 3210 displays information about the product, such as its materials, its place of production, inspection results for each production step, a history of the distribution process, and a description of the product. In addition, when a product 3260 is conveyed by a conveyer belt, the product 3260 can be inspected using a semiconductor device 3250 provided for the product 3260 and a reader/writer 3240 (FIG. 14C). In this manner, by using the semiconductor device in a system, information can be obtained easily and higher performance and higher added value are achieved.

The semiconductor device of the invention has a wide range of uses in addition to the examples above. The semiconductor device can be applied to any product of which information such as history is clarified wirelessly and made use of in production, management, and so on of the product. For example, the semiconductor device of the invention can be applied to bills, coins, securities, certificates, bearer bonds, containers for packaging, books, storage media, personal belongings, means of transportation, groceries, clothing, health products, daily commodities, medicines, electronic equipment, and the like. Examples of these will be described, with reference to FIGS. 15A to 15H.

Figure 15A:
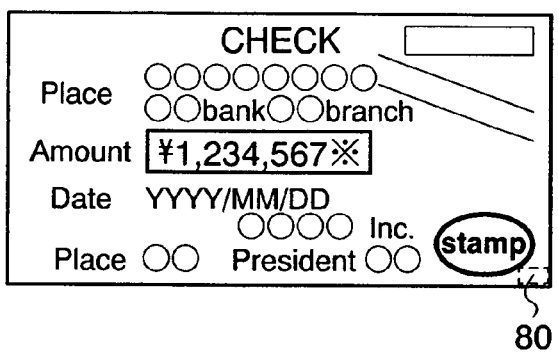
FIGS. 15A to 15H show examples of modes of using a semiconductor device of the invention.

Bills and coins refer to money that is circulated in the market, and include something that can be used in the same way as money in a specific area (such as a cash voucher), commemorative coins, and the like. Securities refers to checks, bonds, promissory notes, and the like (FIG. 15A).

Figure 15B:
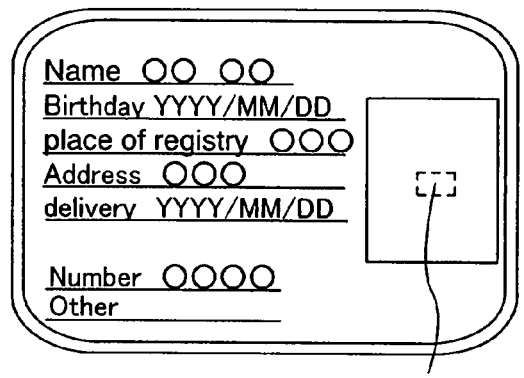
Figure 15C:
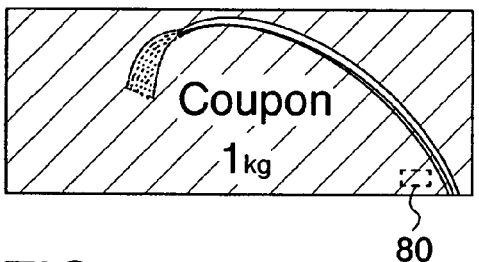
Figure 15D:
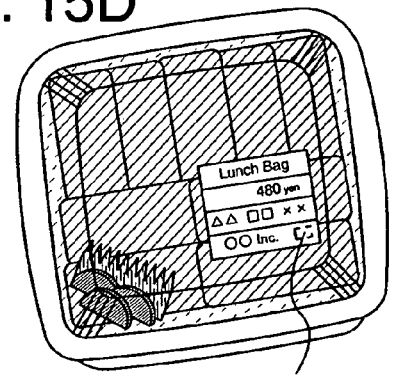
Figure 15E:
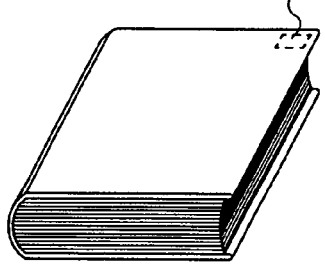
Figure 15F:
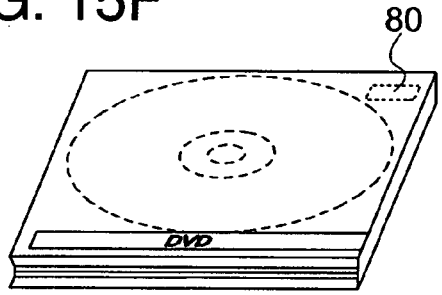
Figure 15G:
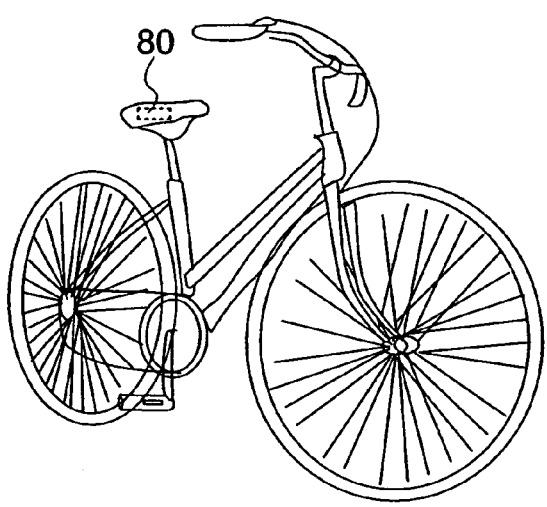
Figure 15H:
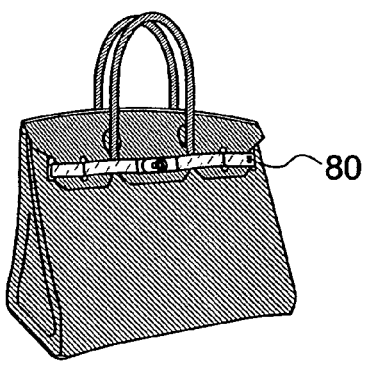
Figure 16A:
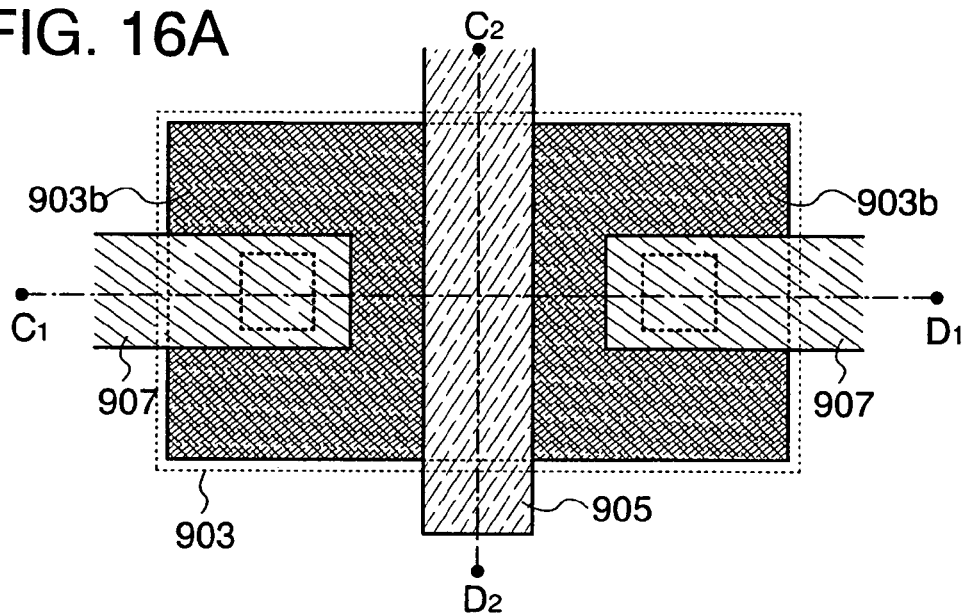
FIGS. 16A to 16C show an example of a conventional semiconductor device.
Figure 16B:
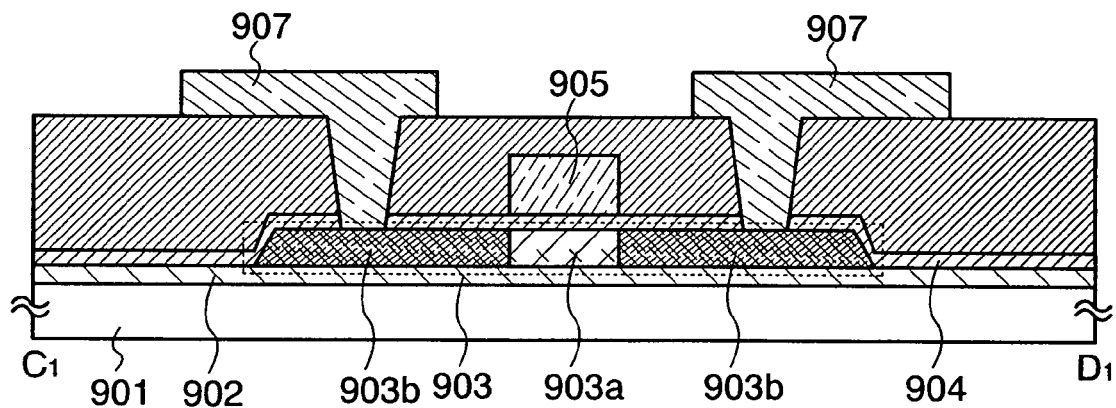
Figure 16C:
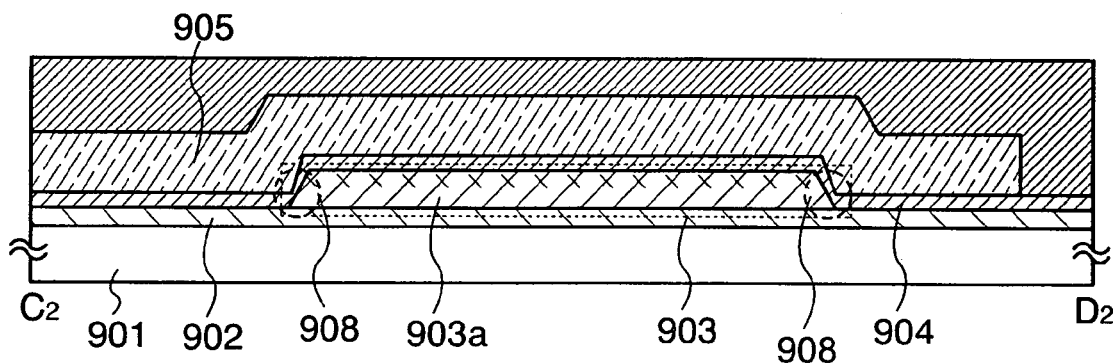

Certificates refers to driver's licenses, resident's cards, and the like (FIG. 15B). Bearer bonds refers to stamps, rice coupons, various gift coupons, and the like (FIG. 15C). Containers for packaging refers to wrapping for box lunches and the like, plastic bottles, and the like (FIG. 15D). Books refers to paperback books, hardback books, and the like (FIG. 15E). Storage media refers to DVD software, video tapes, and the like (FIG. 15F). Means of transportation refers to ships, wheeled vehicles such as bicycles, and the like (FIG. 15G). Personal belongings refers to bags, glasses, and the like (FIG. 15H). Groceries refers to foods, beverages, and the like. Clothing refers to garments, shoes, and the like. Health products refers to medical appliances, health appliances, and the like. Daily commodities refers to furniture, light fittings, and the like. Medicines refers to pharmaceuticals, agricultural chemicals, and the like. Electronic equipment refers to liquid crystal display devices, EL display devices, television devices (e.g., televisions, flat screen televisions), cellular phones, and the like.

By providing the semiconductor device 80 for bills, coins, securities, certificates, bearer bonds, and the like, forgery can be prevented. Further, by providing the semiconductor device 80 for containers for packaging, books, storage media, personal belongings, groceries, daily commodities, electronic equipment, and the like, the efficiency of an inspection system, a rental shop system, or the like can be improved. By providing the semiconductor device 80 for means for transportation, health products, medicines, and the like, forgery and theft can be prevented, and in the case of medicines, mistakes in the taking of medicine can be prevented. The semiconductor device 80 may be provided by being affixed to a surface of an article, implanted in an article, or the like. For example, the semiconductor may be implanted in the paper of a book, implanted in the organic resin of a package made from organic resin, or the like.

In this manner, by providing the semiconductor device for containers for packaging, storage media, personal belongings, groceries, clothing, daily commodities, electronic equipment, or the like, the efficiency of an inspection system, a rental shop system, or the like can be improved. Further, by providing the semiconductor device for means of transportation, forgery and theft can be prevented. Moreover, by implanting the semiconductor in living things such as animals, the living things can easily be identified. For example, by implanting the semiconductor device including a sensor in living things such as domestic animals, it is possible not only to easily obtain information such as their year of birth, sex, and species, but also to easily manage their physical condition, such as their body temperature.

Embodiment 1

Figure 17:
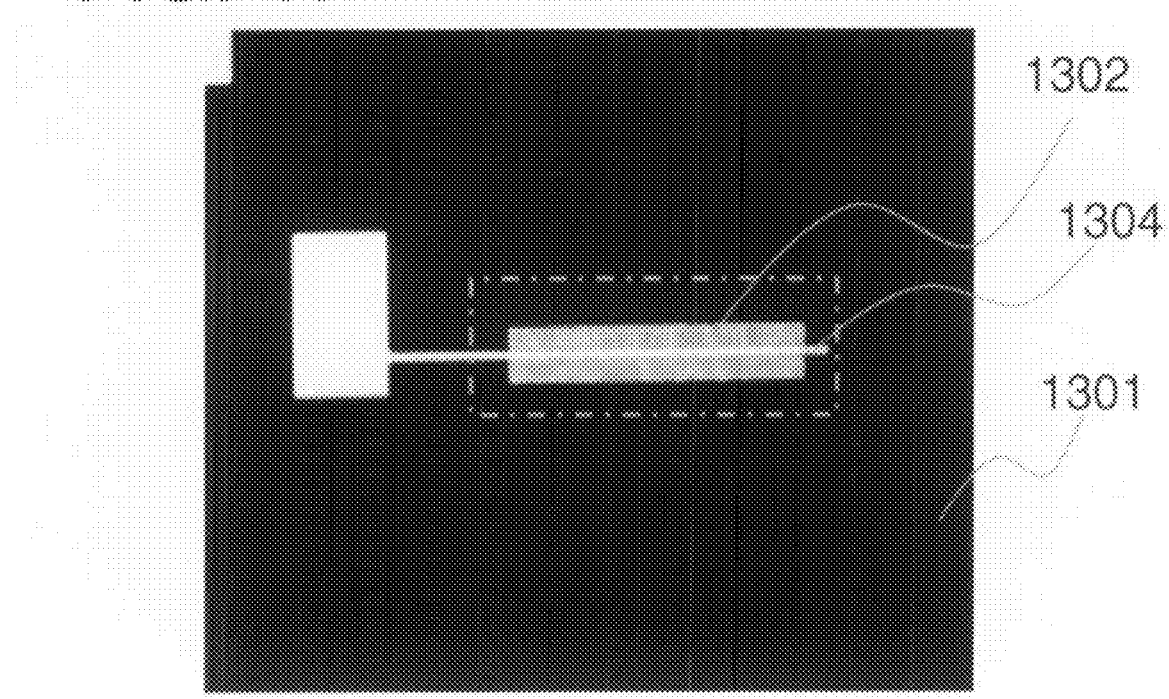
FIG. 17 is an optical microscope photograph of an upper surface of a semiconductor device.
Figure 18:
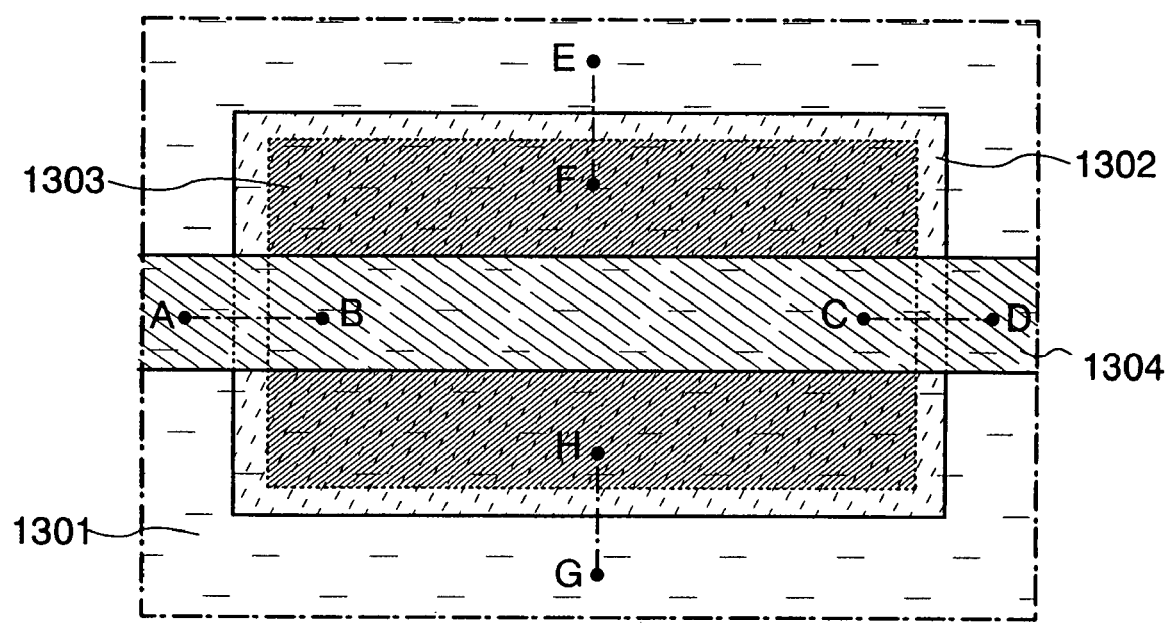
FIG. 18 is a schematic diagram of an upper surface of a semiconductor device.
Figure 19A:
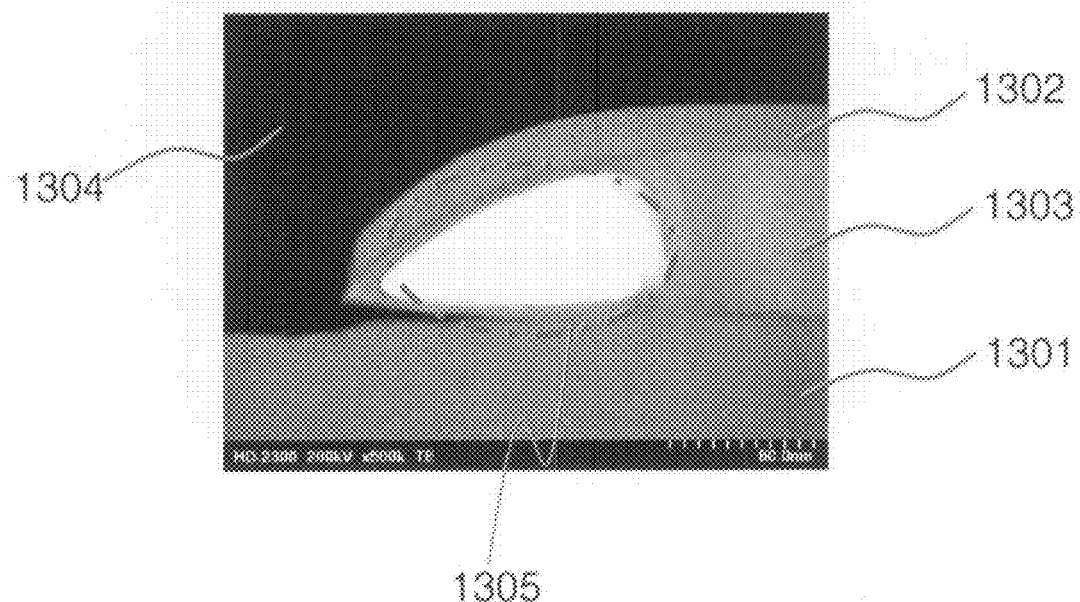
FIGS. 19A and 19B are STEM photographs of cross sections of a semiconductor device.
Figure 19B:
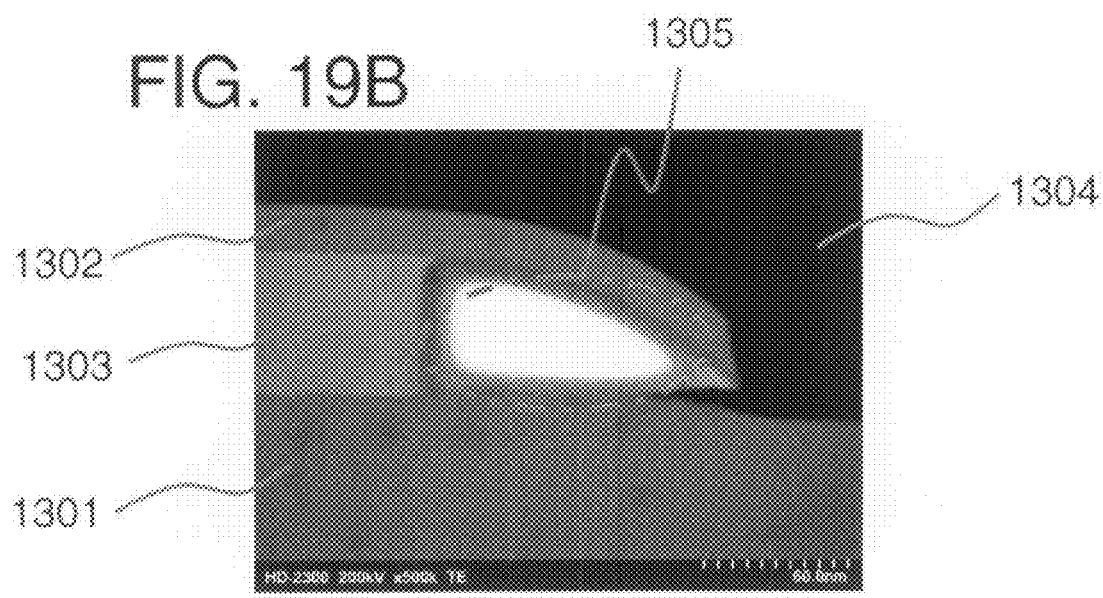
Figure 20A:
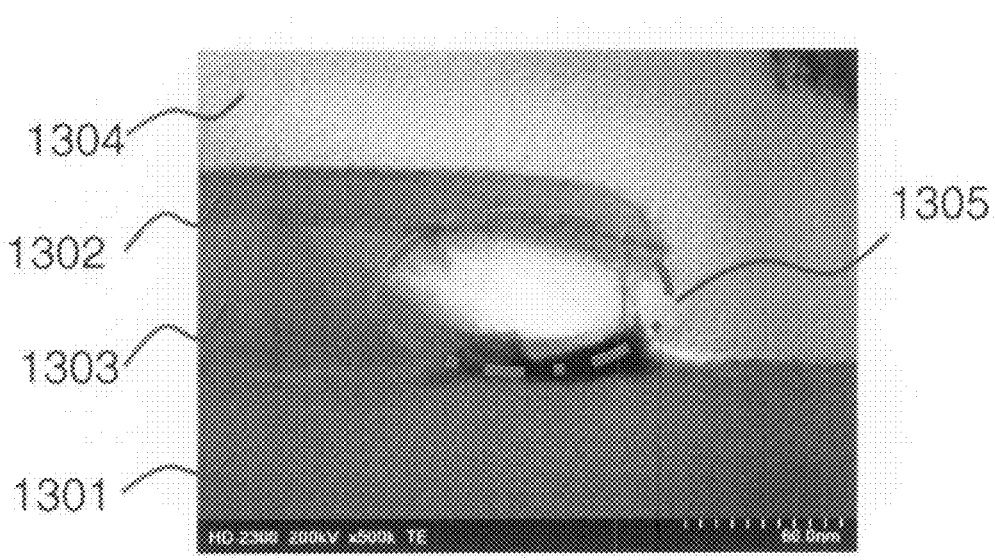
FIGS. 20A and 20B are STEM photographs of cross sections of a semiconductor device.
Figure 20B:
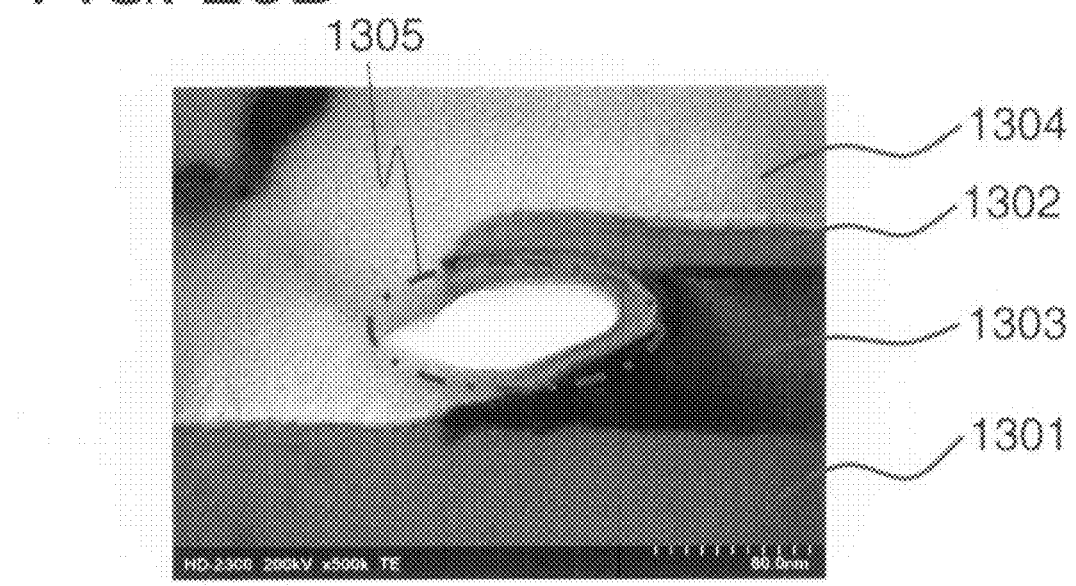

In this embodiment, the results of manufacturing a semiconductor device of the invention will be described with reference to FIGS. 17, 18, 19A and 19B, and 20A and 20B. FIG. 17 is an optical microscope photograph of an upper surface of a semiconductor device manufactured up to and including the stage of a gate electrode in this embodiment. FIG. 18 shows a schematic view of the region in FIG. 17 which is surrounded by a broken line. Further, FIG. 19A is a STEM (scanning transmission electron microscope) photograph of a cross section taken along the broken line joining A and B in FIG. 18. FIG. 19B is a STEM photograph of a cross section taken along the broken line joining C and D in FIG. 18. FIG. 20A is a STEM photograph of a cross section taken along the broken line joining E and F in FIG. 18. FIG. 20B is a STEM photograph of a cross section taken along the broken line joining G and H in FIG. 18. In this embodiment, a semiconductor device including a Si film 1303 formed over a SiON film 1301, a gate insulating film 1302 formed over the Si film 1303 and extending into a region outside end portions of the Si film 1303, and a gate electrode 1304 formed over the gate insulating film 1302 was manufactured.

First, a SiON film 1301 with a thickness of 100 nm was formed over a glass substrate, and a Si film with a thickness of 66 nm was formed over the SiON film 1301. Next, a SiON film with a thickness of 66 nm was formed over the Si film. Subsequently, a resist was formed over the SiON film, and the SiON film and the Si film were dry-etched using the resist as a mask to form an island-shaped Si film and a gate insulating film 1302. Next, etching was conducted using TMAH (tetramethylammonium hydroxide), and the Si film receded back inside end portions of the gate insulating film 1302, thereby forming the Si film 1303. Subsequently, a TaN film with a thickness of 30 nm was formed over the SiON film, and a W film with a thickness of 370 nm was formed over the TaN film. Subsequently, the W film and the TaN film were etched to form a gate electrode 1304. Through the above steps, a semiconductor device including the insulating film 1301, the Si film 1303, the gate insulating film 1302, and the gate electrode 1304 was formed.

It can be seen in FIGS. 19A and 19B that at side surfaces of the Si film, spaces 1305 enclosed by the Si film 1303, the insulating film 1301, and the gate insulating film 1302 are formed. Further, the Si film 1303 and the gate electrode 1304 are not in contact with each other, and a short circuit between the Si film 1303 and the gate electrode 1304 at a side surface of the Si film 1303 was not observed.

Further, from FIGS. 20A and 20B it can be seen that side surfaces of the Si film 1303 are not in contact with the gate insulating film 1302, and spaces 1305 which are adjacent to side surfaces of the Si film 1303 are formed.

Through the above steps, in a semiconductor device of the invention, short-circuits and leakage current caused by insufficient coverage by the gate insulating film at a side surface of a channel forming region do not occur, so the characteristics of the semiconductor device can be improved. Further, electric field concentration is suppressed at side surfaces of the channel forming region, and gate leakage faults are reduced, so the withstand voltage of the gate electrode can be improved.

The present application is based on Japanese priority application No. 2006-126220 filed on Apr. 28, 2006 with the Japanese Patent Office, the entire contents of which are hereby incorporated by reference.

What is claimed is:

1. A semiconductor device comprising:
    a substrate;
    an island-shaped semiconductor film having a channel forming region, formed over the substrate;
    a gate insulating film that covers the island-shaped semiconductor film and has a side surface in a region outside a side surface of the island-shaped semiconductor film; and
    a conductive film that covers the channel forming region with the gate insulating film interposed therebetween,
    wherein the side surface of the island-shaped semiconductor film is not in contact with the gate insulating film and the conductive film.

2. A semiconductor device comprising:
    a substrate;
    an island-shaped semiconductor film having a channel forming region, formed over the substrate;

a gate insulating film that covers the island-shaped semiconductor film and has a side surface in a region outside a side surface of the island-shaped semiconductor film;

a conductive film that covers the channel forming region with the gate insulating film interposed therebetween; and a space enclosed by the side surface of the island-shaped semiconductor film, the gate insulating film, and the substrate.

3. A semiconductor device comprising:

a substrate;

an island-shaped semiconductor film having a channel forming region, formed over the substrate;

a gate insulating film that covers the island-shaped semiconductor film and has a side surface in a region outside a side surface of the island-shaped semiconductor film;

a conductive film that covers the channel forming region with the gate insulating film interposed therebetween; and a space enclosed by the side surface of the island-shaped semiconductor film, the gate insulating film, the conductive film, and the substrate.

4. A semiconductor device comprising:

a substrate;

an island-shaped semiconductor film having a channel forming region, formed over the substrate;

a gate insulating film that covers the island-shaped semiconductor film and has a side surface in a region outside a side surface of the island-shaped semiconductor film;

a conductive film that covers the channel forming region with the gate insulating film interposed therebetween;

an insulating film formed over the conductive film; and a space enclosed by the side surface of the island-shaped semiconductor film, the gate insulating film, the insulating film, and the substrate.

5. The semiconductor device according to claim 2, wherein the side surface of the island-shaped semiconductor film is not in contact with the gate insulating film and the conductive film.

6. The semiconductor device according to claim 3, wherein the side surface of the island-shaped semiconductor film is not in contact with the gate insulating film and the conductive film.

7. The semiconductor device according to claim 4, wherein the side surface of the island-shaped semiconductor film is not in contact with the gate insulating film and the conductive film.

8. The semiconductor device according to claim 1, wherein the conductive film functions as a gate electrode.

9. The semiconductor device according to claim 2, wherein the conductive film functions as a gate electrode.

10. The semiconductor device according to claim 3, wherein the conductive film functions as a gate electrode.

11. The semiconductor device according to claim 4, wherein the conductive film functions as a gate electrode.

12. The semiconductor device according to claim 1, further comprising:

a source electrode and a drain electrode connected to the island-shaped semiconductor film.

13. The semiconductor device according to claim 2, further comprising:

a source electrode and a drain electrode connected to the island-shaped semiconductor film.

14. The semiconductor device according to claim 3, further comprising:

a source electrode and a drain electrode connected to the island-shaped semiconductor film.

15. The semiconductor device according to claim 4, further comprising:

a source electrode and a drain electrode connected to the island-shaped semiconductor film.

* * * * *